United States Patent
Fujita et al.

(10) Patent No.: US 9,864,038 B2
(45) Date of Patent: Jan. 9, 2018

(54) HALL ELECTROMOTIVE FORCE COMPENSATION DEVICE AND HALL ELECTROMOTIVE FORCE COMPENSATION METHOD

(71) Applicant: ASAHI KASEI MICRODEVICES CORPORATION, Tokyo (JP)

(72) Inventors: Taisuke Fujita, Tokyo (JP); Shigeki Okatake, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 319 days.

(21) Appl. No.: 14/406,836

(22) PCT Filed: May 31, 2013

(86) PCT No.: PCT/JP2013/003467
§ 371 (c)(1),
(2) Date: Dec. 10, 2014

(87) PCT Pub. No.: WO2014/002387
PCT Pub. Date: Jan. 3, 2014

(65) Prior Publication Data
US 2015/0115937 A1 Apr. 30, 2015

(30) Foreign Application Priority Data
Jun. 29, 2012 (JP) .................. 2012-147709

(51) Int. Cl.
*G01R 35/00* (2006.01)
*G01R 33/07* (2006.01)
(Continued)

(52) U.S. Cl.
CPC .......... *G01R 35/00* (2013.01); *G01D 3/0365* (2013.01); *G01D 5/142* (2013.01); *G01K 13/00* (2013.01);
(Continued)

(58) Field of Classification Search
CPC .......... G01D 5/145; G01D 5/14; G01R 33/07
See application file for complete search history.

(56) References Cited

U.S. PATENT DOCUMENTS 4,841,272 A * 6/1989 Yamagishi ............ G01L 1/2293
29/621.1
4,875,011 A * 10/1989 Namiki .................. H01L 43/065
257/427
(Continued)

FOREIGN PATENT DOCUMENTS

JP    S57-042865 A    3/1982
JP    6-289111 A    10/1994
(Continued)

OTHER PUBLICATIONS

European Search Report dated Dec. 22, 2015 for corresponding European Patent Application No. 13809803.3.
(Continued)

*Primary Examiner* — Giovanni Astacio-Oquendo
*Assistant Examiner* — Alvaro Fortich
(74) *Attorney, Agent, or Firm* — Morgan, Lewis & Bockius LLP

(57) ABSTRACT

A Hall resistance measurement unit measures a Hall resistance value in two or more current directions between a plurality of terminals of the Hall element. A Hall electromotive force measurement unit measures the Hall electromotive force of the Hall element. A temperature measurement unit measures an operating temperature of the Hall element. A compensation signal generation unit compensates the Hall electromotive force on the basis of the Hall resistance value from the Hall resistance measurement unit and a temperature output value from the temperature measurement unit. A compensation coefficient calculation circuit calculates a compensation coefficient on the basis of the Hall resistance value measured by the Hall resistance measure- (Continued)

ment unit and the temperature output value measured by the temperature measurement unit. The compensation coefficient includes a mechanical stress compensation coefficient and a temperature compensation coefficient.

28 Claims, 14 Drawing Sheets

(51) Int. Cl.
H01L 43/06 (2006.01)
G01D 5/14 (2006.01)
G01K 13/00 (2006.01)
G01D 3/036 (2006.01)

(52) U.S. Cl.
CPC .............. *G01R 33/07* (2013.01); *H01L 43/06* (2013.01); *G01D 5/145* (2013.01)

(56) References Cited

U.S. PATENT DOCUMENTS

| | | | | |
|---|---|---|---|---|
| 6,104,231 | A * | 8/2000 | Kirkpatrick, II | G01R 33/07 327/378 |
| 6,362,618 | B1 | 3/2002 | Motz | |
| 6,483,301 | B2 | 11/2002 | Kempe | |
| 6,906,514 | B2 | 6/2005 | Ausserlechner | |
| 6,956,342 | B1 * | 10/2005 | Fang | H02P 6/34 318/400.08 |
| 7,302,357 | B2 | 11/2007 | Ausserlechner et al. | |
| 7,437,260 | B2 | 10/2008 | Ausserlechner et al. | |
| 2001/0050557 | A1 | 12/2001 | Kempe | |
| 2002/0171420 | A1 * | 11/2002 | Chaparala | G02B 26/0841 324/225 |
| 2005/0001613 | A1 * | 1/2005 | Blossfeld | G01D 5/147 324/251 |
| 2006/0224350 | A1 | 10/2006 | Tanizawa | |
| 2008/0074108 | A1 * | 3/2008 | Ausserlechner | G01R 33/07 324/226 |
| 2008/0308886 | A1 * | 12/2008 | Ausserlechner | B81C 1/00333 257/421 |
| 2009/0009164 | A1 * | 1/2009 | Utsuno | G01R 33/075 324/251 |
| 2009/0108839 | A1 | 4/2009 | Ausserlechner | |
| 2011/0119015 | A1 | 5/2011 | Hirobe et al. | |
| 2012/0086442 | A1 | 4/2012 | Haas et al. | |
| 2012/0112733 | A1 * | 5/2012 | Antonacci | G01R 33/072 323/368 |
| 2012/0210800 | A1 * | 8/2012 | Huber | G01D 3/0365 73/777 |

FOREIGN PATENT DOCUMENTS

| | | | |
|---|---|---|---|
| JP | 2003-014788 | * | 1/2003 |
| JP | 2003-014788 A | | 1/2003 |
| JP | 2008-096213 A | | 4/2008 |
| JP | 2008-292182 A | | 12/2008 |
| JP | 2009-139213 A | | 6/2009 |
| JP | 2012-18081 A | | 1/2012 |

OTHER PUBLICATIONS

International Preliminary Report on Patentability dated Dec. 31, 2014, for the corresponding International application No. PCT/JP2013/003467.

Ausserlechner, et al., "Compensation of the Piezo-Hall Effect in Integrated Hall Sensors on (100)-Si", IEEE Sensors Journal, vol. 7, No. 11, pp. 1475-1482, Nov. 2007.

Halg, "Piezo-Hall Coefficients of n-type Silicon", J. Appl. Phys., vol. 64, No. 1, pp. 276-282, Jul. 1988.

International Search Report dated Aug. 6, 2013, for International Application No. PCT/JP2013/003467.

* cited by examiner

<Phase2>

<Phase1>

<Phase2>

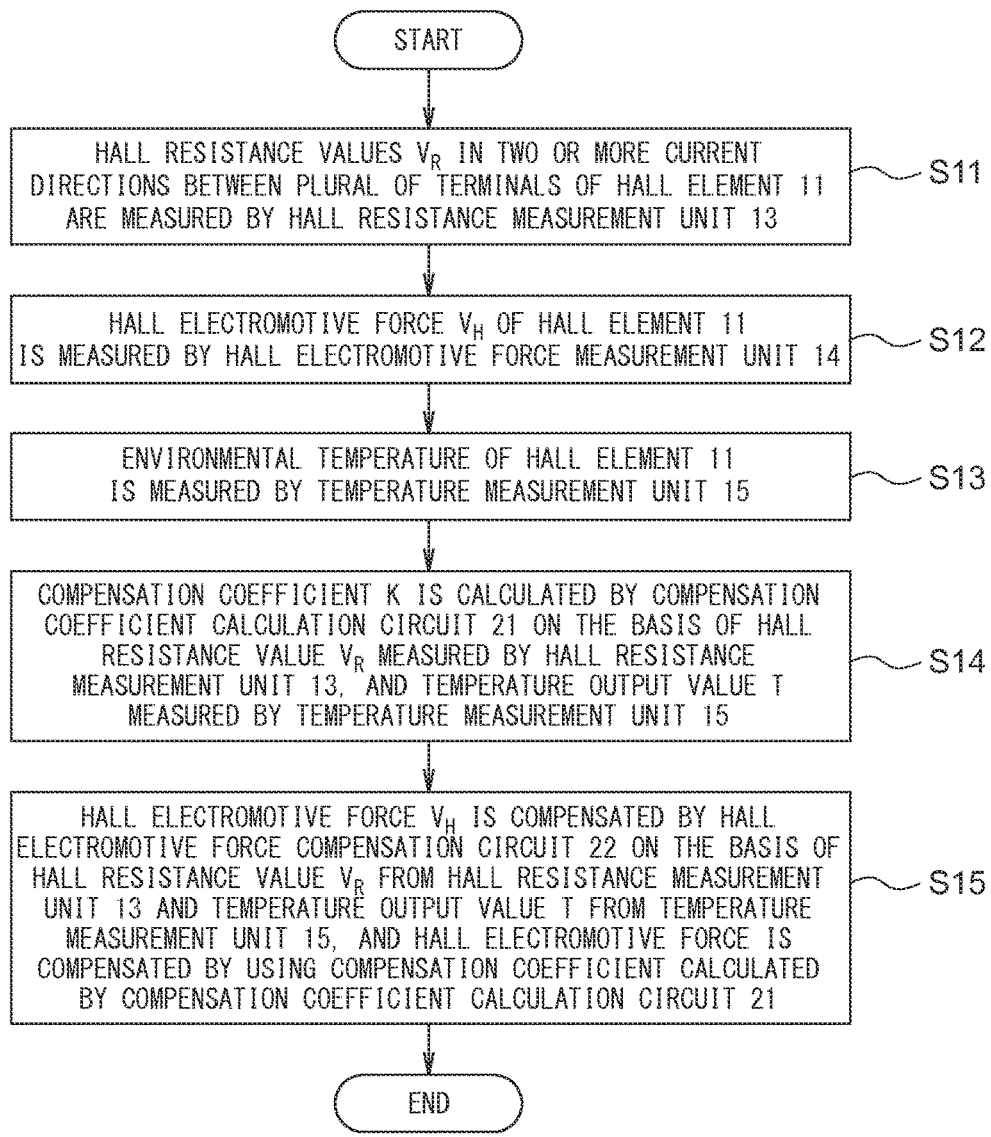

HALL ELECTROMOTIVE FORCE COMPENSATION DEVICE AND HALL ELECTROMOTIVE FORCE COMPENSATION METHOD

TECHNICAL FIELD

The present invention relates to a Hall electromotive force compensation device and a Hall electromotive force compensation method, and in more detail, relates to a Hall electromotive force compensation device and a Hall electromotive force compensation method capable of compensating influence of mechanical stress applied to a Hall element and influence of temperature concurrently.

BACKGROUND ART

A current sensor for detecting a magnetic field generated by current, a angle sensor for detecting rotational angle of a magnet, a position sensor for detecting displacement of a magnet, and the like have been known as magnetic-sensor semiconductor integrated circuit having Hall elements built therein.

It is known that magnetic sensitivity of Hall element varies depending on the temperature. Therefore, it is necessary to compensate the influence of the temperature in order to compensate the magnetic sensitivity of the Hall element with high accuracy. Furthermore, it is known that the magnetic sensitivity of the Hall element varies depending not only on the temperature effect but also on the mechanical stress effect (Piezo-Hall Effect).

FIG. 1 is a cross-section view of a package structure in which a semiconductor integrated circuit of a magnetic sensor is encapsulated. The package structure includes a semiconductor integrated circuit 3 of the magnetic sensor on a lead frame 1, a Hall element 2 incorporated into the semiconductor integrated circuit 3, and a molding resin 4 surrounding the semiconductor integrated circuit 3. In this package structure, since thermal expansion coefficients of silicon, the lead frame 1, the resin 4, and the like are different from one another, mechanical stress occurs at several positions including the surface of the silicon. Furthermore, the mechanical stress varies due to the change in temperature and humidity of the operating condition. Accordingly, there is a problem in that the magnetic sensitivity of the semiconductor integrated circuit of the magnetic sensor varies depending on the operating condition.

In order to address such a problem in that the magnetic sensitivity of the semiconductor integrated circuit of the magnetic sensor varies depending on the operating condition, for example, PTL 1 discloses that a change of the mechanical stress is detected by using a change of an offset of the Hall element in order to compensate the magnetic sensitivity.

Furthermore, PTL 2, for example, discloses that the change of the mechanical stress is detected by using a change of a resistance value of the Hall element (Hall resistance value) in order to compensate the magnetic sensitivity by feeding back the detection result of the mechanical stress to a drive current of the Hall device (Hall drive current).

Further, PTL 3 to PTL 5, and NPL1, for example, disclose that a mechanical stress detection element other than the Hall element is utilized in order to compensate the magnetic sensitivity on the basis of the mechanical stress detection result.

Further, PTL 6, for example, discloses a method of reducing the mechanical stress applied to the Hall element by improving a package material or a package structure.

Further, in order to address a problem in that the magnetic sensitivity of the Hall element varies depending on temperature, for example, PTL 7 discloses that the magnetic sensitivity is compensated by use of a one-chip microcomputer controlling a power supply voltage of the Hall element.

CITATION LIST

Patent Literature

PTL 1: U.S. Pat. No. 6,362,618 B2
PTL 2: U.S. Pat. No. 6,483,301 B2
PTL 3: U.S. Pat. No. 6,906,514 B2
PTL 4: U.S. Pat. No. 7,437,260 B2
PTL 5: U.S. Pat. No. 7,302,357 B2
PTL 6: JP 2008-292182 A
PTL 7: JP 2009-139213 A

Non Patent Literature

NPL1: Udo Ausserlechner, Mario Motz, Michael Holliber, IEEE Sensors Jouranal, Vol., No. 11, November 2007
NPL2: B. Halg, "Piezo-Hall Coefficients of n-type Silicon", J. Appl. Phys., vol. 64, pp. 276-282, 1988

SUMMARY OF INVENTION

According to one aspect of the present invention, there is provided a Hall electromotive force compensation device including a Hall element configured to generate a Hall electromotive force, and a compensation signal generation unit configured to generate a signal for compensating the Hall electromotive force of the Hall element. The compensation signal generation unit is configured to generate the signal for compensating the Hall electromotive force of the Hall element on a basis of information depending on plural resistance values across different terminal pairs of the Hall element and temperature information of the Hall element.

BRIEF DESCRIPTION OF DRAWINGS

FIG. 24 is a flow chart illustrating a Hall electromotive force compensation method corresponding to a Hall electromotive force compensation device according to the first embodiment of the present invention.

DESCRIPTION OF EMBODIMENTS

In order to explain the problem to be solved by the embodiment of the present invention, the above-mentioned technologies will be described.

First, PTL 1 describes a circuit configuration in which a Hall electromotive force and the offset of the Hall element are time-divisionally detected by connection switching of a chopper switch provided to select a pair of terminals to which the Hall drive current flows and a pair of terminals across which the Hall electromotive force from the Hall element is detected according to a chopper clock, to obtain not only the Hall electromotive force but also information on a mechanical stress on the Hall element.

Figure 1:
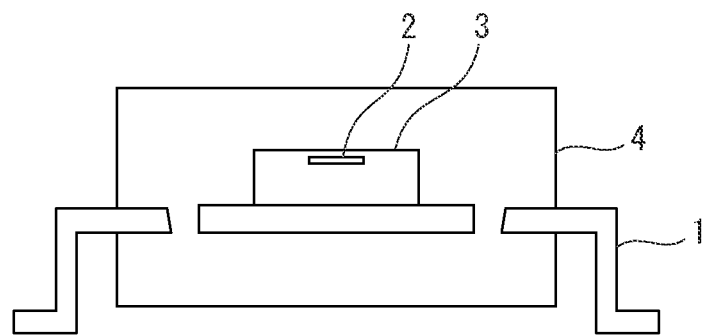
FIG. 1 is a cross-section view of a package structure in which a semiconductor integrated circuit of a magnetic sensor is encapsulated.
Figure 2:
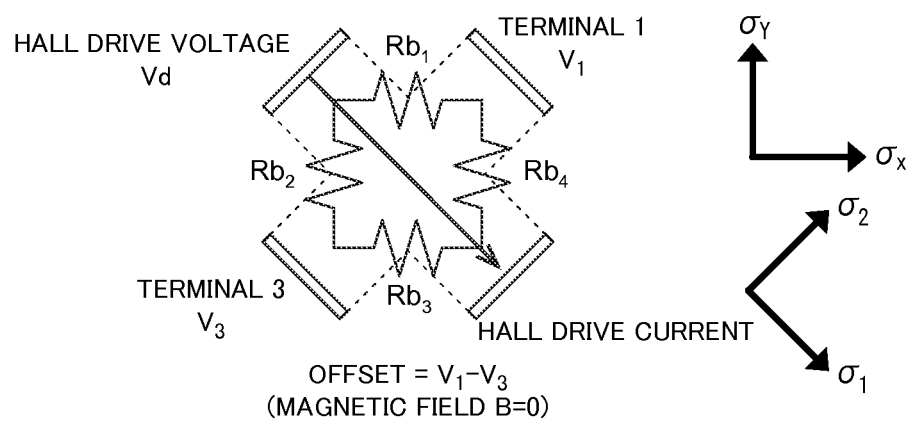
FIG. 2 is a view illustrating a bridge model of a Hall element and the direction of mechanical stress.

FIG. 2 is a view illustrating a bridge model of the Hall element and the direction of the mechanical stress. FIG. 2 indicates the relationship between the offset of the Hall element and the mechanical stress. The Hall element can be generally described by using the bridge model. When the current flows in the direction of the arrow indicated in FIG. 2 in this bridge model, the offset voltage is represented as a voltage difference ($V_1-V_3$) across the terminals located diagonally opposite positions. Bridge resistances $Rb_1$, $Rb_2$, $Rb_2$, and $Rb_4$ vary with the stress $\sigma_X$ and $\sigma_Y$, and are represented by following expressions (1).

$$Rb_1 = Rb_{10}(1+\pi_L(T)\sigma_X+\pi_T(T)\sigma_Y)$$

$$Rb_2 = Rb_{20}(1+\pi_L(T)\sigma_Y+\pi_T(T)\sigma_X)$$

$$Rb_3 = Rb_{30}(1+\pi_L(T)\sigma_X+\pi_T(T)\sigma_Y)$$

$$Rb_4 = Rb_{40}(1+\pi_L(T)\sigma_Y+\pi_T(T)\sigma_X) \quad (1)$$

$\pi_L$: piezo-resistance coefficient in the direction parallel to the current $\pi_T$: piezo-resistance coefficient in the direction perpendicular to the current $Rb_{10}$: resistance value of the bridge resistance $Rb_1$ when mechanical stress is zero $Rb_{20}$: resistance value of the bridge resistance $Rb_2$ when mechanical stress is zero $Rb_{30}$: resistance value of the bridge resistance $Rb_3$ when mechanical stress is zero $Rb_{40}$: resistance value of the bridge resistance $Rb_4$ when mechanical stress is zero By using expressions (1), the offset voltage ($V_1-V_3$) is represented by following expressions (2).

$$V_1 = \frac{Rb_4}{Rb_1+Rb_4}Vd \quad (2)$$

$$V_3 = \frac{Rb_3}{Rb_2+Rb_3}Vd$$

$$V_1-V_3 = \left(\frac{Rb_4}{Rb_1+Rb_4}-\frac{Rb_3}{Rb_2+Rb_3}\right)Vd$$

When calculating by using a following expression (3) in order to simplify the calculation, the offset voltage ($V_1-V_3$) is represented by following expression (4).

$$Rb_{10} = Rb_{20} = Rb_{30} = Rb_{40} = Rb_0 \quad (3)$$

$$V_1-V_3 = \left(\frac{Rb_4}{Rb_1+Rb_4}-\frac{Rb_3}{Rb_2+Rb_3}\right)Vd = \quad (4)$$

$$\left(\frac{Rb_0(1+\pi_L(T)\sigma_y+\pi_T(T)\sigma_s)}{Rb_0(2+(\sigma_s+\sigma_y)(\pi_L(T)+\pi_L(T)))} - \right.$$

$$\left.\frac{Rb_0(1+\pi_L(T)\sigma_s+\pi_Y(T)\sigma_y)}{Rb_0(2+(\sigma_s+\sigma_y)(\pi_L(T)+\pi_T(T)))}\right)Vd =$$

$$\frac{(\sigma_x-\sigma_y)(\pi_Y(T)-\pi_L(T))}{(2+(\sigma_x+\sigma_y)(\pi_L(T)+\pi_y(T)))}Vd$$

From expression (4), a value including the stresses $\sigma_X$ and $\sigma_Y$ is obtained by using the offset of the Hall element. The Hall electromotive force and the magnetic sensitivity of the Hall element are represented by following expressions (5). SI (T, $\sigma$) denotes the magnetic sensitivity of the Hall element and depends on the temperature (T) and the mechanical stress ($\sigma$). As is known from the following expressions (5), it can be seen that the sum of the stresses $\sigma_1$ and $\sigma_2$ is required to compensate the mechanical stress dependency of the magnetic sensitivity. The mechanical stress is a tensor quantity, thus it is difficult to obtain the sum of the stresses $\sigma_1$ and $\sigma_2$ from expression (4). Therefore, it is difficult to compensate the stress dependency of the magnetic sensitivity in PTL1.

$V_H = SI(T,\sigma) \times I \times B$: Hall electromotive force $SI(T,\sigma) = \alpha_{SI}(T) SI_0(T_0)(1 + P_{12}(\sigma_1 + \sigma_2))$: magnetic sensitivity $\alpha_{SI}(T)$: temperature characteristic of magnetic sensitivity $SI_0(T_0)$: magnetic sensitivity at temperature $T_0$ when stress is zero $P_{12}$: piezo-Hall coefficient (5)

Next, a mechanical stress compensation method of PTL 2 will be described by using FIG. 3, FIG. 4A, and FIG. 4B.

Figure 3:
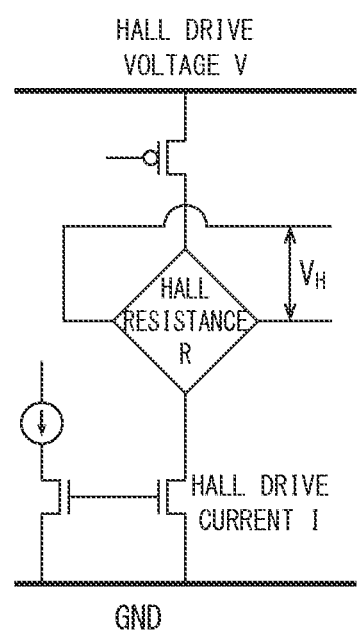
FIG. 3 is a circuit configuration diagram illustrating an example of driving a Hall element.
Figure 4A:
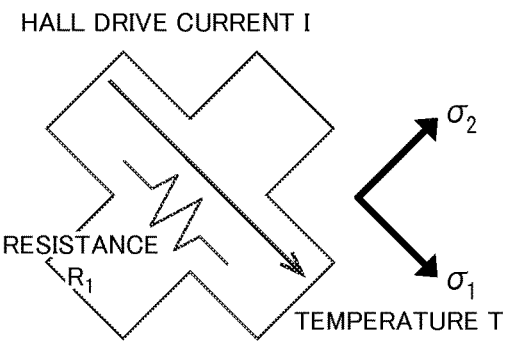
FIG. 4A and FIG. 4B are views illustrating Hall resistance values with respect to two current directions.
Figure 4B:
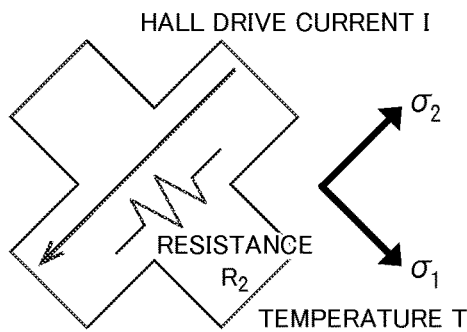

FIG. 3 is a circuit configuration diagram illustrating an example of driving the Hall element, and FIG. 4A and FIG. 4B are views illustrating the Hall resistance values with respect to two current directions.

The Hall electromotive force $V_H$ illustrated in FIG. 3 and the magnetic sensitivity of the Hall element are expressed by following expressions (6) and (7).

$$V_H = SI(T, \sigma) \times I \times B : \text{Hall electromotive force} \quad (6)$$
$$B = \frac{V_H}{SI(T, \sigma) \times I}: \text{magnetic field}$$

$$SI = \alpha_{SI}(T) SI_0(T_0)(1 + \alpha_{PH}(\sigma)) \quad (7)$$
$$\alpha_{PH}(\sigma) = P_{12}(\sigma_1 + \sigma_2)$$
$\alpha_{SI}(T)$: temperature characteristic of magnetic sensitivity
$SI_0(T_0)$: magnetic sensitivity at temperature $T_0$ when stress is zero As in the case of the magnetic sensitivity of the Hall element, the Hall resistance value depends on the temperature (T) and the mechanical stress ($\sigma$). The Hall resistance values $R_1$ and $R_2$ illustrated in FIG. 4 are represented as following expressions (8) by using the piezo-resistance coefficients $\pi_L$ and $\pi_T$.

$$R_1 = \alpha_R(T) R_{01}(T_0)(1 + \pi_L \sigma_1 + \pi_T \sigma_2) \quad (8)$$
$$R_2 = \alpha_R(T) R_{02}(T_0)(1 + \pi_L \sigma_2 + \pi_T \sigma_1)$$
$$\frac{R_1 + R_2}{2} \approx \alpha_R(T) R_0(T_0)(1 + \alpha_{PR}(\sigma))$$
$$\alpha_{PR}(\sigma) = \frac{\pi_L + \pi_T}{2}(\sigma_1 + \sigma_2)$$

$\alpha_R(T)$: temperature characteristic of Hall element resistance
$R_0(T_0)$: Hall element resistance value
at temperature $T_0$ when stress is zero In PTL 2, the Hall drive current is set by using expressions (8), so as to be a value proportional to the average of the Hall resistances in the two directions.

$I = G(T) \times \alpha_R(T) I_0 (1 + \alpha_{PR}(\sigma))$ $G(T)$: proportionality coefficient (9)

Following expression (10) is obtained by substituting Expressions (7) and (9) into expression (6).

$$V_H = SI(T, \sigma) \times I \times B = \quad (10)$$
$$\alpha_{SI}(T) SI_0(T_0)(1 + \alpha_{PH}(\sigma)) \times G(T) \alpha_R(T) I_0 (1 + \alpha_{PR}(\sigma)) \times B =$$
$$G(T) \alpha_{SI}(T) \alpha_R(T) \times (1 + \alpha_{PR}(\sigma))(1 + \alpha_{PR}(\sigma)) \times SI_0(T_0) I_0 B$$

In PTL 2, the influence of the mechanical stress is compensated by setting the Hall drive current to be a current value proportional to the Hall resistances in the two directions as seen from expression (10). However, in order to make expression (10) have a constant value, following expressions (11) and (12) should be satisfied.

$$G(T) = \frac{1}{\alpha_{SI}(T) \alpha_R(T)} \quad (11)$$

$$(1 + \alpha_{PH}(\sigma))(1 + \alpha_{PR}(\sigma)) = 1 \quad (12)$$

In PTL 2, there is no temperature sensor, therefore the temperature dependency of expression (11) has to be obtained as a temperature characteristic of the Hall drive current. However, this temperature characteristic involves a remarkably difficult function having a high-order coefficient, thus it is difficult to realize a high accuracy.

Furthermore, as described in PTL 2, expression (12) is based on the following expression (13).

$$\alpha_{PR}(\sigma) = -\alpha_{PH}(\sigma) \Rightarrow -P_{12} = \pi_L + \pi_T \quad (13)$$

Figure 5:
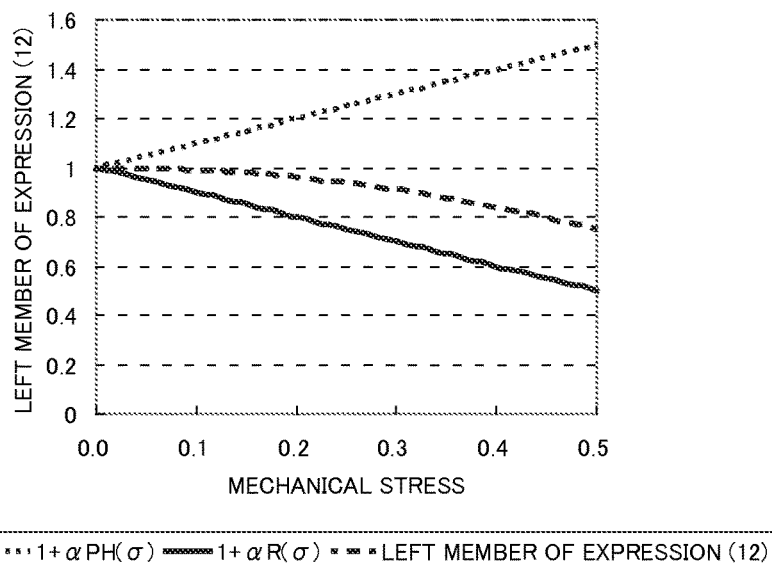
FIG. 5 is a view representing a calculation result of a left member of expression (12)

In reality, $-P_{12} \approx \pi_L + \pi_T$ holds only approximately even at room temperature. The above equation is invalidated in the temperature variation FIG. 5 is a view representing the calculation result of the left member of expression (12). From FIG. 5, it can be seen that the left member of expression (12) comes close to "1" as long as the absolute values of $\alpha_{PR}(\sigma)$ and $\alpha_{PH}(\sigma)$ are small, but the left member of expression (12) deviates from "1" when the absolute values of $\alpha_{PR}(\sigma)$ and $\alpha_{PH}(\sigma)$ become large. This indicates the expression (12) is not satisfied when the absolute value of the mechanical stress is large, and the effect of the compensation of the mechanical stress degrades significantly.

That is, the compensation of the magnetic sensitivity in PTL 2 has a low accuracy, and the range of the mechanical stress where the compensation is effective is limited.

Next, PTL 3 discloses a technique relating to a semiconductor integrated circuit having a sensor function for detecting a signal of a physical quantity such as a magnetic field signal. PTL 3 describes a configuration of the semiconductor integrated circuit, in which the above-mentioned mechanical stress is detected by using a mechanical stress detection element disposed separately from a physical quantity detection unit having the sensor function for the purpose of compensating a detection error in sensor signal detection which occurs in the sensor function due to the effect of the mechanical stress generated in the semiconductor integrated circuit, especially in the semiconductor integrated circuit encapsulated in a package. The effect of the above-mentioned mechanical stress in the sensor function is controlled on the basis of the detection result of the mechanical stress, and finally the error in the sensor signal detection due to the above-mentioned mechanical stress is reduced.

Next, PTL 4 discloses a concept of compensating and reducing a detection error in sensor signal detection due to an internal mechanical stress of a semiconductor integrated circuit having a sensor function. In the specific technique disclosed in PTL 4, the effect of the above-mentioned mechanical stress on an output signal of a semiconductor integrated circuit is controlled by combining signals output from the first and the second elements, respectively, having sensitivity for the above-mentioned mechanical stress.

Next, the PTL 5 discloses a concept of compensating and reducing a detection error in sensor signal detection due to an internal mechanical stress of a semiconductor integrated circuit having a sensor function. The technique described in PTL 5 is characterized by using two mechanical stress detection elements disposed separately from a physical quantity detection unit having a sensor function. PTL 5 describes that it is possible to detect information on the above-mentioned mechanical stress with high accuracy by combining two signals obtained from these two elements.

Next, NPL 1 describes a circuit for compensating variations in magnetic sensitivity of a Hall element due to an internal mechanical stress of a semiconductor integrated circuit in a case where the Hall element is realized by using the semiconductor integrated circuit formed on a silicon (100) surface. In NPL 1, the above-mentioned mechanical stress is detected by combining two elements, which are an N-type diffusion resistor and a P-type diffusion resistor having a sensitivity for the mechanical stress.

Further, in NPL 1, the N-type diffusion resistor and the P-type diffusion resistor are prepared for the purpose of detecting the mechanical stress acting on the Hall element formed in the semiconductor integrated circuit. Regarding not only NPL 1, but also PTL 3, PTL 4, and PTL 5, the techniques disclosed in these literatures detect the internal mechanical stress of the semiconductor integrated circuit by using the mechanical stress detection element disposed at a position different from the position of the sensor unit in the semiconductor integrated circuit.

That is, the methods described in PTL 3, PTL 4, PTL 5, and NPL 1 ignore a difference in the mechanical stress caused by the positions of the Hall element. Furthermore, the mechanical stress detection element disposed separately from the Hall element increases a layout area and current consumption.

Next, the PLT 6 discloses a method of reducing a mechanical stress applied to a sensor by improving a package. Such a technique defines the shape and the size of the package, thus the range of use of this technique is limited.

Next, PTL 7 discloses a method relating to temperature dependency of the magnetic sensitivity of a Hall element. However, such a method does not compensate the effect of the mechanical stress.

As stated above, the above-mentioned technologies have a problem of low accuracy of the mechanical stress compensation in a case where the magnetic sensitivity and the mechanical stress signal are measured with single Hall element, like the method described in PTL 1 and PTL 2. Furthermore, the method described in PTL 3, PTL 4, PTL 5, and NPL 1 can improve the accuracy of the mechanical stress compensation by separating the mechanical stress detection element from the Hall element, but have a problem of the increased layout area and the current consumption.

Furthermore, the above-mentioned technologies do not disclose anything about a technology effective for both of the mechanical stress dependency and the temperature dependency of the magnetic sensitivity of the Hall element.

The embodiment of the present invention has been made in view of the above-described problem, and has an object to provide a Hall electromotive force compensation device and a Hall electromotive force compensation method capable of compensating the magnetic sensitivity of the Hall element with high accuracy more easily, by using one Hall element and a temperature sensor to perform the mechanical stress compensation and the temperature compensation while suppressing the increase of the layout area and the current consumption.

Figure 6:
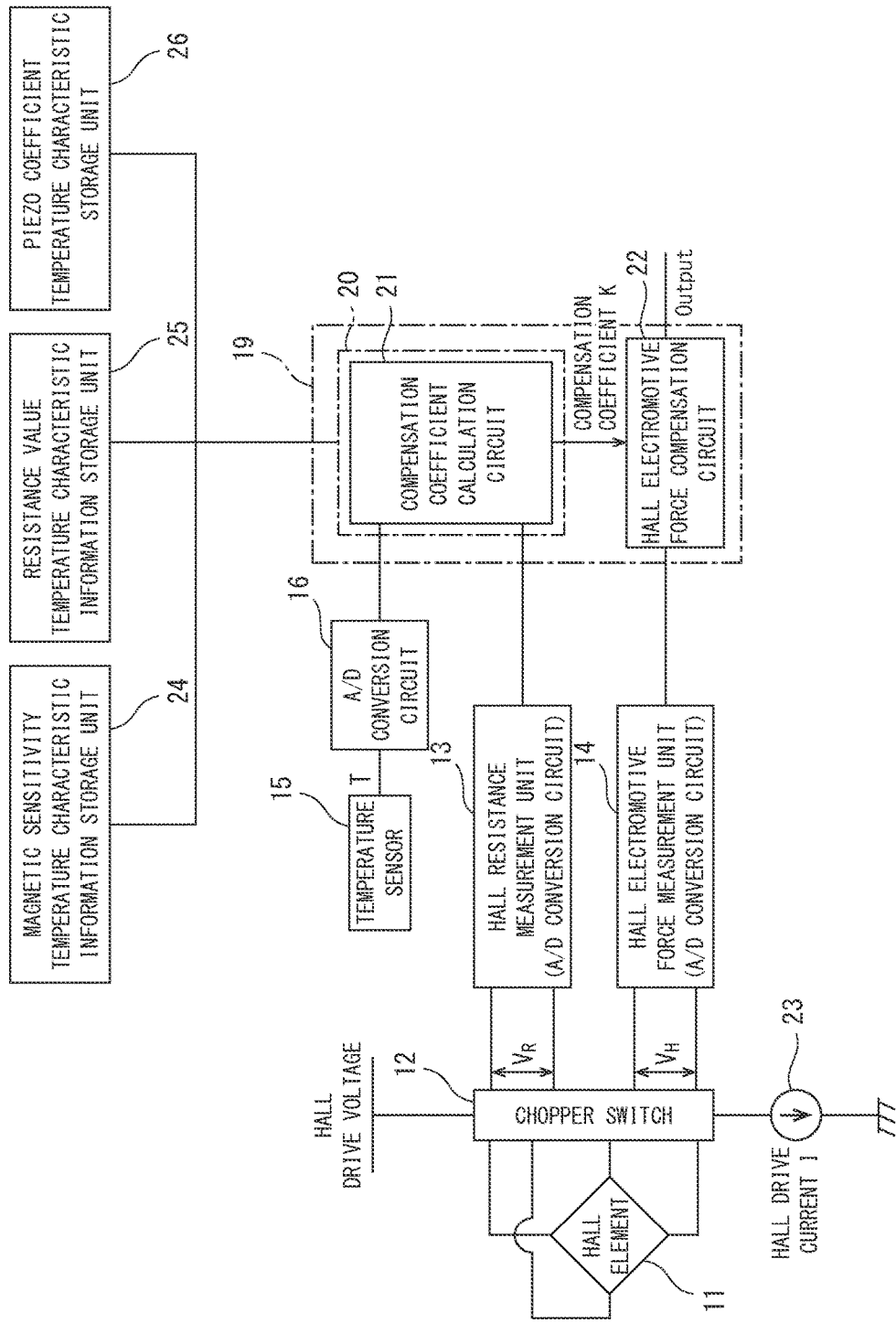
FIG. 6 is a configuration block diagram illustrating a Hall electromotive force compensation device according to the first embodiment of the present invention.

The embodiment of the present invention has been made to achieve the above object. A Hall electromotive force compensation device according to the embodiment of the present invention includes a Hall element (11) configured to generate a Hall electromotive force, and a compensation signal generation unit (20) configured to generate a signal for compensating the Hall electromotive force of the Hall element. The compensation signal generation unit (20) is configured to generate the signal for compensating the Hall electromotive force of the Hall element on a basis of information depending on plural resistance values across different terminal pairs of the Hall element and temperature information of the Hall element (FIG. 6; the first embodiment).

Additionally, the Hall electromotive force compensation device includes a Hall electromotive force compensation unit (19) configured to compensate a physical quantity based on the Hall electromotive force on a basis of a compensation signal from the compensation signal generation unit.

Additionally, the compensation signal generation unit is configured to generate the signal for compensating the Hall electromotive force of the Hall element on a basis of information on a temperature characteristic of a magnetic sensitivity of the Hall element.

Additionally, the compensation signal generation unit is configured to generate the signal for compensating the Hall electromotive force of the Hall element on a basis of information on a temperature characteristic of the plural resistance values of the Hall element.

Additionally, the compensation signal generation unit is configured to generate the signal for compensating the Hall electromotive force of the Hall element on a basis of information on a temperature characteristic of a piezo coefficient of the Hall element.

Additionally, the information on the temperature characteristic of the piezo coefficient of the Hall element is at least one of information on a temperature characteristic of a piezo-Hall coefficient of the Hall element or information on a temperature characteristic of a piezo-resistance coefficient of the Hall element.

Figure 17:
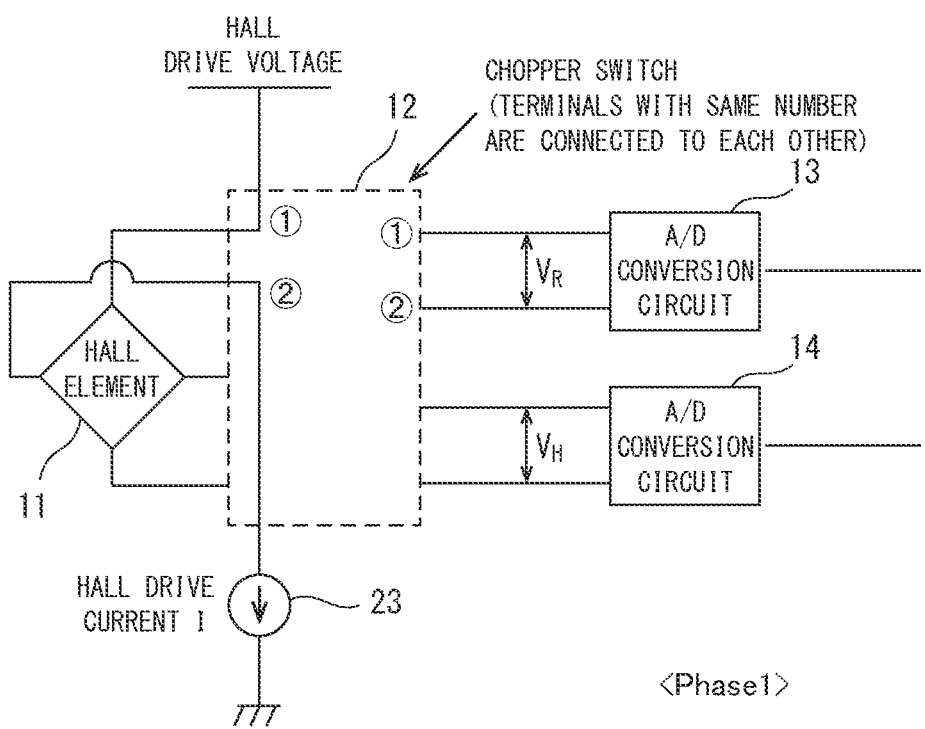
FIG. 17 is a configuration block diagram illustrating a Hall electromotive force compensation device according to the fifth embodiment of the present invention, and a circuit configuration diagram illustrating an example of driving a Hall element (Phase 1: Hall resistance value measurement)
Figure 18:
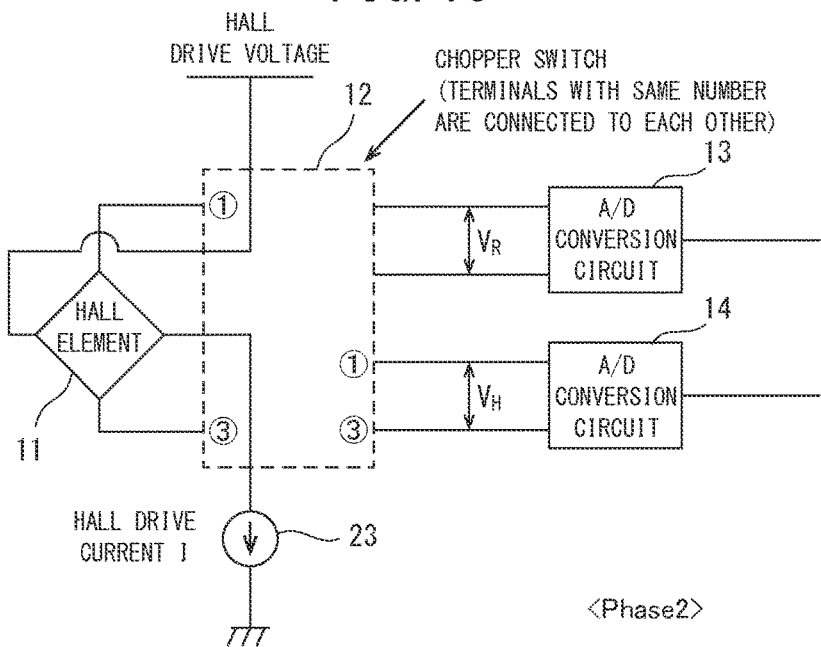
FIG. 18 is a configuration block diagram illustrating a Hall electromotive force compensation device according to the fifth embodiment of the present invention, and a circuit configuration diagram illustrating an example of driving a Hall element (Phase 2: Hall electromotive force measurement)

Additionally, the Hall electromotive force compensation device includes a chopper switch (12) connected to a first terminal, a second terminal, a third terminal, and a fourth terminal of the Hall element. The chopper switch is configured to apply a Hall drive voltage across the first terminal and the second terminal to supply a Hall drive current (I) when a Hall resistance value ($V_R$) is measured across the first terminal and the second terminal, and is configured to apply the Hall drive voltage across the second terminal and the fourth terminal to supply the Hall drive current when the Hall electromotive force ($V_H$) is measured across the first terminal and the third terminal, by use of chopper drive (FIG. 17, FIG. 18; the fifth embodiment).

Additionally, the Hall electromotive force compensation device includes a Hall electromotive force measurement unit (14) configured to measure the Hall electromotive force ($V_H$) of the Hall element, a Hall resistance measurement unit

(13) configured to measure the plural resistance values across the different terminal pairs of the Hall element to output the information depending on the plural resistance values, and a temperature measurement unit (15) configured to measure an environmental temperature of the Hall element to output the temperature information of the Hall element.

Figure 12:
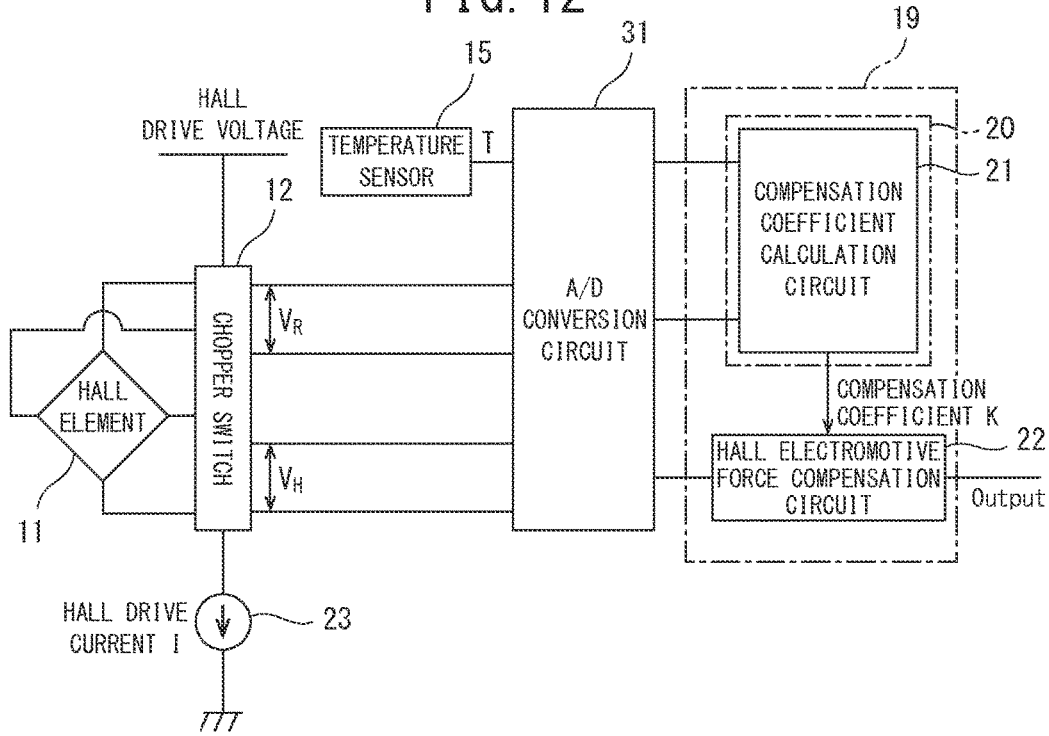
FIG. 12 is a configuration block diagram illustrating a Hall electromotive force compensation device according to the second embodiment of the present invention.

Additionally, the Hall resistance measurement unit (13), the Hall electromotive force measurement unit (14), and the temperature measurement unit (15) commonly use a shared A/D conversion circuit (31) (FIG. 12; the second embodiment).

Additionally, the Hall resistance measurement unit is configured to measure the plural resistance values across the different terminal pairs of the Hall element having a cross shape.

Additionally, the temperature measurement unit is a temperature sensor.

Additionally, the compensation signal generation unit includes a compensation coefficient calculation circuit (21).

Figure 13:
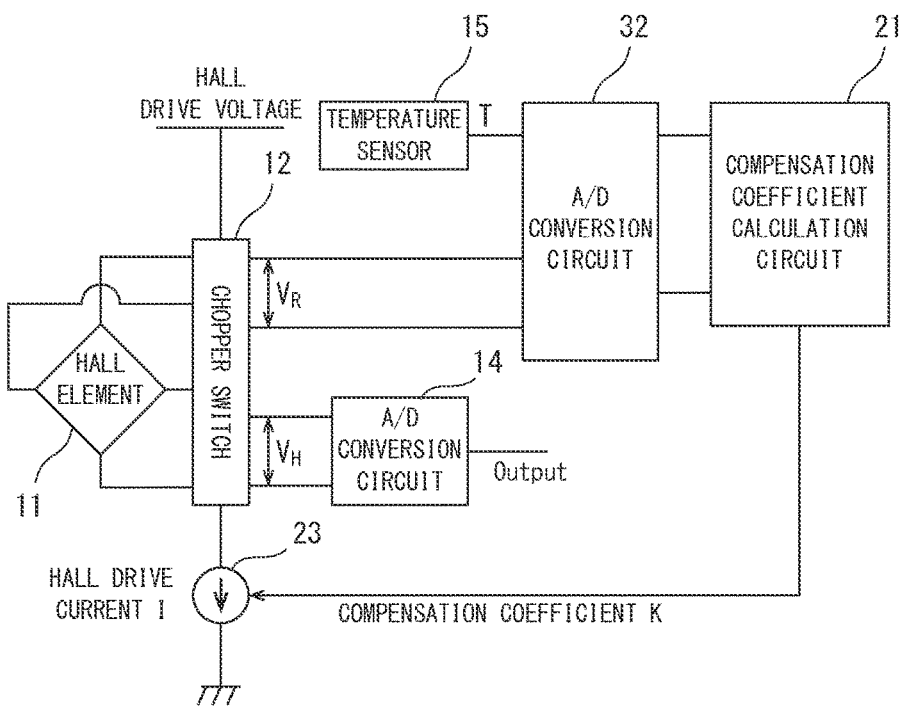
FIG. 13 is a configuration block diagram illustrating a Hall electromotive force compensation device according to the third embodiment of the present invention.

Additionally, a current supplied by a Hall drive current source (23) for driving the Hall element is adjusted on a basis of a compensation coefficient from the compensation coefficient calculation circuit (21) to compensate the Hall electromotive force (FIG. 13; the third embodiment).

Figure 15:
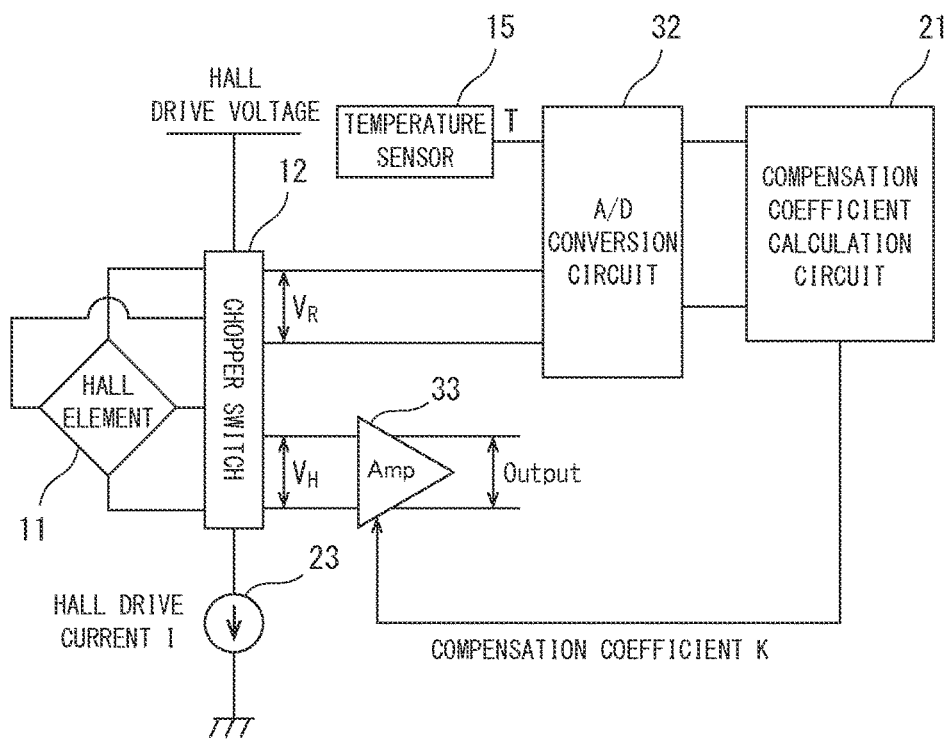
FIG. 15 is a configuration block diagram illustrating a Hall electromotive force compensation device according to the fourth embodiment of the present invention.

Additionally, the Hall electromotive force compensation device includes an amplifier circuit (33) configured to amplify the Hall electromotive force from the Hall electromotive force measurement unit. A gain of the amplifier circuit is adjusted on a basis of a compensation coefficient from the compensation coefficient calculation circuit to compensate the Hall electromotive force (FIG. 15; the fourth embodiment).

Figure 19:
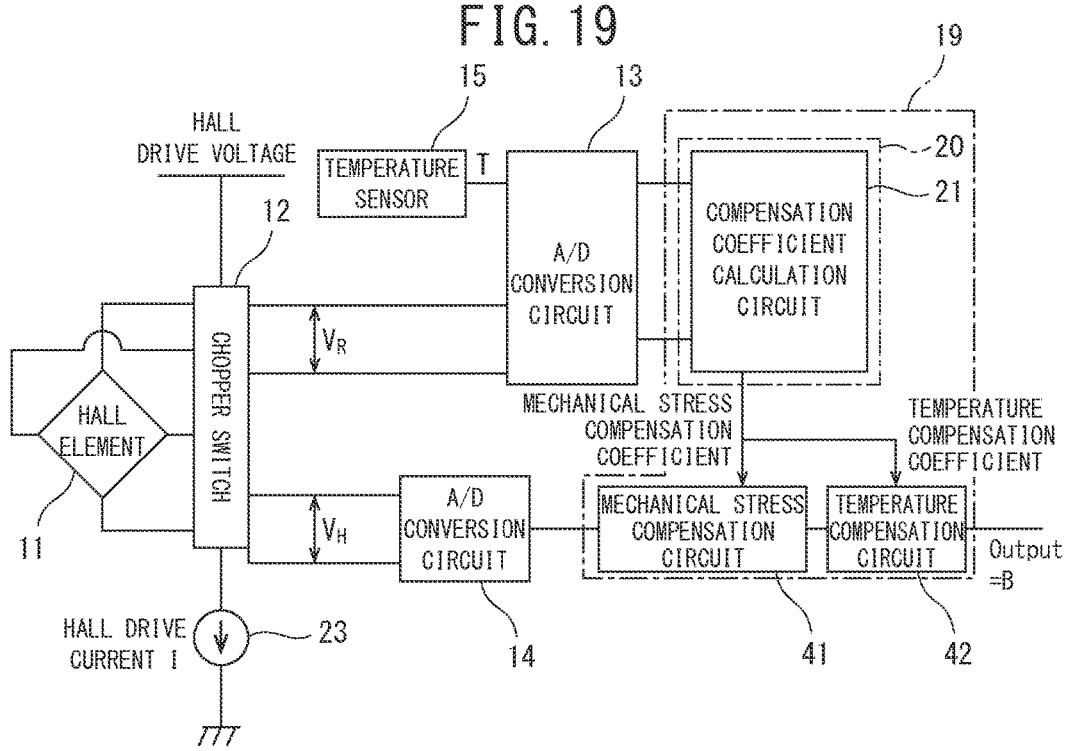
FIG. 19 is a configuration block diagram illustrating a Hall electromotive force compensation device according to the sixth embodiment of the present invention.

Additionally, the Hall electromotive force compensation device includes a mechanical stress compensation circuit (41) and a temperature compensation circuit (42) in a subsequent stage of the Hall electromotive force measurement unit. The Hall electromotive force is compensated on a basis of a mechanical stress compensation coefficient and a temperature compensation coefficient from the compensation coefficient calculation circuit (FIG. 19; the sixth embodiment).

Additionally, a Hall electromotive force compensation method according to the embodiment of the present invention is used in a Hall electromotive force compensation device including a Hall element configured to generate a Hall electromotive force, and a compensation signal generation unit configured to generate a signal for compensating the Hall electromotive force of the Hall element. The Hall electromotive force compensation method including a compensation signal generation step performed by the compensation signal generation unit for generating the signal for compensating the Hall electromotive force of the Hall element on a basis of information depending on plural resistance values across different terminal pairs of the Hall element and temperature information of the Hall element.

Additionally, the Hall electromotive force compensation method includes compensating a physical quantity based on the Hall electromotive force by a Hall electromotive force compensation unit on a basis of a compensation signal from the compensation signal generation unit.

Additionally, the compensation signal generation step performed by the compensation signal generation unit includes generating the signal for compensating the Hall electromotive force of the Hall element on a basis of information on a temperature characteristic of a magnetic sensitivity the Hall element.

Additionally, the compensation signal generation step performed by the compensation signal generation unit includes generating the signal for compensating the Hall electromotive force of the Hall element on a basis of information on a temperature characteristic of the plural resistance values of the Hall element.

Additionally, the compensation signal generation step performed by the compensation signal generation unit includes generating the signal for compensating the Hall electromotive force of the Hall element on a basis of information on a temperature characteristic of a piezo coefficient of the Hall element.

Additionally, the information on the temperature characteristic of the piezo coefficient of the Hall element is at least one of information on a temperature characteristic of a piezo-Hall coefficient of the Hall element or information on a temperature characteristic of a piezo-resistance coefficient of the Hall element.

Additionally, a chopper switch is provided to be connected to a first terminal, a second terminal, a third terminal, and a fourth terminal of the Hall element. A Hall drive voltage is applied across the first terminal and the second terminal to supply a Hall drive current when a Hall resistance value is measured across the first terminal and the second terminal, and the Hall drive voltage is applied across the second terminal and the fourth terminal to supply the Hall drive current when the Hall electromotive force is measured across the first terminal and the third terminal, by use of chopper drive by the chopper switch.

Additionally, the Hall electromotive force compensation method includes a Hall electromotive force measurement step for measuring the Hall electromotive force of the Hall element, a Hall resistance measurement step for measuring the plural resistance values across the different terminal pairs of the Hall element to output the information depending on the plural resistance values, and a temperature measurement step for measuring an environmental temperature of the Hall element to output the temperature information of the Hall element.

Additionally, measurement of the plural resistance values in the Hall resistance measurement step, measurement of the Hall electromotive force in the Hall electromotive force measurement step, and measurement of a temperature value in the temperature measurement step is time-divisionally performed by using a common A/D conversion circuit.

Additionally, the Hall resistance measurement step includes measuring the plural resistance values across the different terminals of the Hall element having a cross shape.

Additionally, the temperature measurement step includes measuring with a temperature sensor.

Additionally, the compensation signal generation step performed by the compensation signal generation unit includes generating a compensation signal by a compensation coefficient calculation circuit.

Additionally, the Hall electromotive force compensation method includes adjusting a current supplied by a Hall drive current source for driving the Hall element on a basis of a compensation coefficient from the compensation coefficient calculation circuit to compensate the Hall electromotive force.

Additionally, an amplifier circuit is provided to amplify the Hall electromotive force measured in the Hall electromotive force measurement step. A gain of the amplifier circuit is adjusted on a basis of a compensation coefficient from the compensation coefficient calculation circuit to compensate the Hall electromotive force.

Additionally, a mechanical stress compensation circuit and a temperature compensation circuit are provided in a subsequent stage after measurement of the Hall electromotive force in the Hall electromotive force measurement step. The Hall electromotive force is compensated on a basis of a mechanical stress compensation coefficient and a temperature compensation coefficient from the compensation coefficient calculation circuit.

Hereinafter, embodiments of the present invention will be described with reference to the drawings.

First Embodiment

FIG. 6 is a configuration block diagram illustrating a Hall electromotive force compensation device according to the first embodiment of the present invention. In the drawings, reference numeral 11 represents a Hall element, reference numeral 12 represents a chopper switch, reference numeral 13 represents a Hall resistance measurement unit (A/D conversion circuit), reference numeral 14 represents a Hall electromotive force measurement unit (A/D conversion circuit), reference numeral 15 represents a temperature sensor (temperature measurement unit), reference numeral 16 represents an A/D conversion circuit, reference numeral 19 represents a Hall electromotive force compensation unit, reference numeral 20 represents a compensation signal generation unit, reference numeral 21 represents a compensation coefficient calculation circuit, reference numeral 22 represents a Hall electromotive force compensation circuit, reference numeral 23 represents a Hall drive current source, reference numeral 24 represents a magnetic sensitivity temperature characteristic information storage unit, reference numeral 25 represents a resistance value temperature characteristic information storage unit, and reference numeral 26 represents a piezo coefficient temperature characteristic storage unit.

The Hall electromotive force compensation device according to the present invention is configured to perform mechanical stress compensation and temperature compensation for the Hall electromotive force on the basis of the mechanical stress and the temperature affecting the magnetic sensitivity of the Hall element 11, and includes the Hall element 11 generating the Hall electromotive force, and the compensation signal generation unit 20 generating a signal for compensating the Hall electromotive force of the Hall element 11.

The compensation signal generation unit 20 is configured to generate the signal for compensating the Hall electromotive force of the Hall element 11 on the basis of information depending on plural resistance values across different terminal pairs of the Hall element 11 and temperature information of the Hall element 11, and includes the compensation coefficient calculation circuit 21.

Further, the Hall electromotive force compensation device according to the present invention includes the Hall electromotive force compensation unit 19 configured to compensate a physical quantity based on the Hall electromotive force on the basis of the compensation signal from the compensation signal generation unit 20.

The compensation signal generation unit 20 is configured to generate the signal for compensating the Hall electromotive force of the Hall element 11 on the basis of information on a temperature characteristic of a magnetic sensitivity of the Hall element 11, and is configured to generate the signal for compensating the Hall electromotive force of the Hall element 11 on the basis of information on a temperature characteristic of the plural resistance values of the Hall element 11, and furthermore, is configured to generate the signal for compensating the Hall electromotive force of the Hall element 11 on the basis of information on a temperature characteristic of a piezo coefficient of the Hall element 11.

The Hall resistance measurement unit 13 is configured to measure a Hall resistance value $V_R$ across different terminals of the Hall element 11. The Hall electromotive force measurement unit 14 is configured to measure the Hall electromotive force $V_H$ of the Hall element 11. Furthermore, the temperature measurement unit 15 is configured to measure an environmental temperature of the Hall element 11.

The Hall electromotive force compensation unit 19 includes the compensation coefficient calculation circuit 21 and the Hall electromotive force compensation circuit 22, and is configured to compensate the physical quantity based on the Hall electromotive force $V_H$ on the basis of the Hall resistance value $V_R$ from the Hall resistance measurement unit 13 and a temperature output value T from the temperature measurement unit 17. The physical quantity based on the Hall electromotive force $V_H$ includes not only the Hall electromotive force $V_H$ but also a magnetic sensitivity SI(T, σ) of the Hall element, a Hall drive current I, and a magnetic field B, on the basis of $V_H$=SI(T,σ)×I×B.

The Hall electromotive force compensation device includes the Hall element 11 and the Hall drive current source 23 for driving the Hall element 11, and the chopper switch 12 which is a switch group for driving the Hall element 11 by use of chopper drive.

In the magnetic sensitivity temperature characteristic information storage unit 24, the information on the temperature characteristic of the magnetic sensitivity of the Hall element 11 is stored. The compensation signal generation unit 20 is configured to compensate the Hall electromotive force by using the information on the temperature characteristic of the magnetic sensitivity of the Hall element 11.

In the resistance value temperature characteristic information storage unit 25, the information on the temperature characteristic of the resistance value of the Hall element 11 is stored. The compensation signal generation unit 20 is configured to compensate the Hall electromotive force by using the information on the temperature characteristic of the resistance value of the Hall element 11.

In the piezo coefficient temperature characteristic storage unit 26, the information on the temperature characteristic of the piezo coefficient of the Hall element 11 is stored. The compensation signal generation unit 20 is configured to generate the signal for compensating the Hall electromotive force by using the information on the temperature characteristic of the piezo coefficient of the Hall element 11.

In the first embodiment, information on the temperature characteristic of a piezo-Hall coefficient of the Hall element 11 and information on the temperature characteristic of a piezo-resistance coefficient of the Hall element 11 are stored in the piezo coefficient temperature characteristic storage unit 26. The compensation signal generation unit 20 generates the signal for compensating the Hall electromotive force by using the information on the temperature characteristic of the piezo-Hall coefficient of the Hall element 11 and the information on the temperature characteristic of the piezo-resistance coefficient of the Hall element 11. The piezo coefficients may include the piezo-Hall coefficient and the piezo-resistance coefficient.

Figure 7:
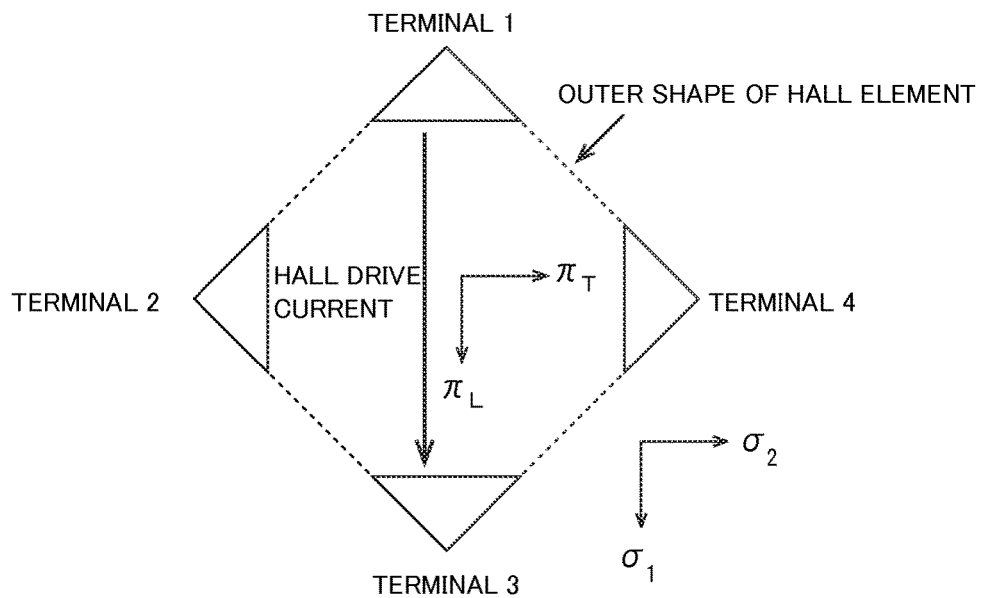
FIG. 7 is a view illustrating an example of an outer shape of a Hall element illustrated in FIG. 6.

FIG. 7 is a view illustrating an example of an outer shape of the Hall element illustrated in FIG. 6. The chopper switch 12 is configured to control the connections to a terminal 1 to a terminal 4. The Hall resistance value $V_R$ and the Hall electromotive force $V_H$ of the Hall element 11 are supplied to the analog to digital conversion circuits (A/D conversion circuits), respectively.

Figure 8:
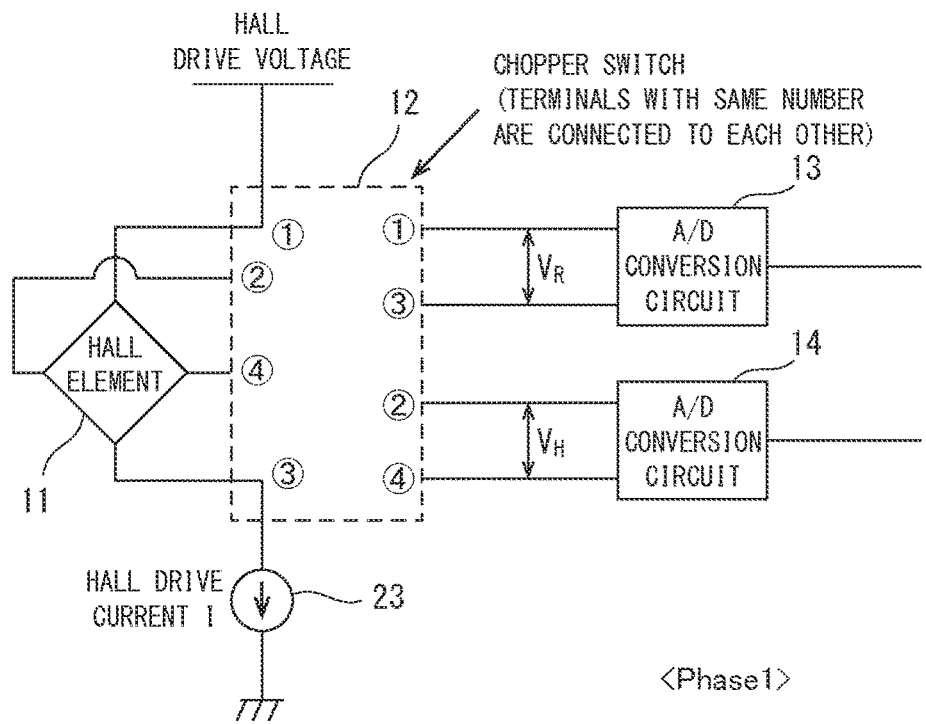
FIG. 8 is a circuit configuration diagram illustrating an example of driving a Hall element (Phase 1)
Figure 9:
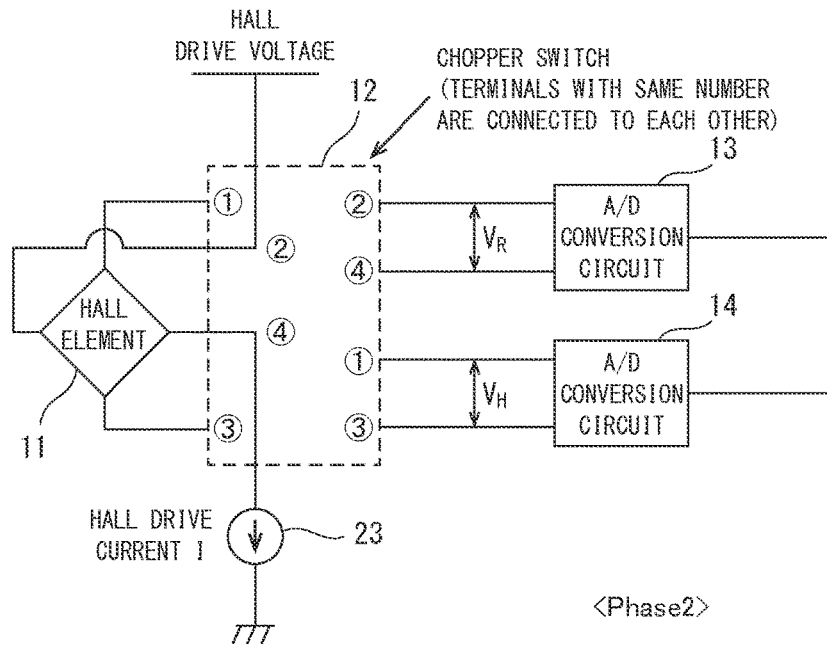
FIG. 9 is a circuit configuration diagram illustrating an example of driving a Hall element (Phase 2)

FIG. 8 is a circuit configuration diagram illustrating an example of driving the Hall element (Phase 1), and FIG. 9 is a circuit configuration diagram illustrating an example of driving the Hall element (Phase 2). The supply of the Hall resistance value $V_R$ and the Hall electromotive force $V_H$ to the A/D conversion circuits is performed by use of chopper drive, as illustrated in FIG. 8 (Phase 1) and FIG. 9 (Phase 2).

That is, in Phase 1 illustrated in FIG. 8, when a Hall drive voltage is applied across the terminal 1 and the terminal 3 to supply the Hall drive current I, the Hall resistance value $V_R$ is measured across the terminal 1 and the terminal 3, and the Hall electromotive force $V_H$ is measured across the terminal 2 and the terminal 4. Next, in Phase 2 illustrated in FIG. 9, when the Hall drive voltage is applied across the terminal 2 and the terminal 4 to supply the Hall drive current I, the Hall resistance value $V_R$ is measured across the terminal 2 and the terminal 4, and the Hall electromotive force $V_H$ is measured across the terminal 1 and the terminal 3.

Furthermore, The Hall electromotive force compensation device includes the temperature sensor and the A/D conversion circuit 16 configured to convert a temperature sensor output to a digital signal. The Hall resistance value $V_R$ and the digital signal T of the temperature are supplied to the compensation coefficient calculation circuit 21 of the compensation signal generation unit 20. The Hall electromotive force $V_H$ and the Hall resistance value $V_R$ are represented by following expressions (14).

$V_H = SI(T, \sigma) \times I \times B$: Hall electromotive force $SI(T, \sigma) = \alpha_{SI}(T) SI_0 (1 + P_{12}(T)(\sigma_1 + \sigma_2))$: magnetic sensitivity of Hall element $\alpha_{SI}(T)$: magnetic sensitivity temperature characteristic of Hall element $P_{12}(T)$: piezo-Hall coefficient $SI_0$: magnetic sensitivity of Hall element at reference temperature when stress is zero (14)

$R_1 = \alpha_R(T) R_0 (1 + \pi_L(T)\sigma_1 + \pi_T(T)\sigma_2)$: Hall resistance value in Phase 1

$R_2 = \alpha_R(T) R_0 (1 + \pi_L(T)\sigma_2 + \pi_T(T)\sigma_1)$: Hall resistance value in Phase 2

$\alpha_R(T)$: temperature characteristic of resistance value of Hall element $\pi_L(T)$: piezo resistance coefficient (component parallel to current)

$\pi_T(T)$: piezo resistance coefficient (component perpendicular to current)

$R_0$: Hall resistance value at reference temperature when stress is zero (15)

The Hall resistance values in the above-mentioned Phase 1 and Phase 2 are Hall resistance values when driving the Hall element as illustrated in FIG. 8 and FIG. 9.

By transforming expression (15), a sum of mechanical stress components in two directions are obtained as seen in expression (16).

$$(\sigma_1 + \sigma_2) = \frac{1}{\pi_L(T) + \pi_T(T)} \frac{R_1 + R_2 - 2\alpha_R(T) R_0}{\alpha_R(T) R_0} \quad (16)$$

The piezo-Hall coefficient and the piezo-resistance coefficient in the silicon (100) surface are known values as reported in NPL 2, and are listed by following table 1.

TABLE 1

| Conduction type | Type | Longitudinal | Transverse | πL (1/10^11/Pa) | πT (1/10^11/Pa) | P12 (1/10^11/Pa) |
|---|---|---|---|---|---|---|
| n | diffusion | <100> | <010> | −102.2 | 53.4 | 45 |
|  |  | <110> | <1-10> | −31.2 | −17.6 |  |

Furthermore, the temperature characteristic ($\alpha_{SI}$) of the magnetic sensitivity of the Hall element, the temperature characteristic ($\alpha_R$) of the Hall resistance value, a reference magnetic sensitivity ($SI_0$), and a reference Hall resistance value ($R_0$) can be measured by a test before packaging, or may be some representative values measured in advance if variations between samples are tolerated. The Hall drive current can be also measured by a test before shipment.

Additionally, the information on the temperature characteristic ($\alpha_{SI}$) of the magnetic sensitivity, the temperature characteristic ($\alpha_R$) of the Hall resistance value may be stored as either one of "a formula" or "a table".

As stated above, all of the parameter values in expressions (14) to (16) are known or can be measured, thus it is possible to calculate the magnetic sensitivity accurately. Since the magnetic sensitivity can be calculated accurately, it is possible to detect the magnetic field accurately.

Specifically, by using expressions (14) and (16), the magnetic field B is represented by expressions (17) and (18).

$$B = \frac{V_H(= SI(T, \sigma) \times I \times B)}{I} \times \frac{1}{SI(T, \sigma)} = \frac{V_H}{K} \quad (17)$$

$K \equiv SI(T, \sigma) \times I$ $$K = SI(T, \sigma) \times I = \alpha_{SI}(T) SI_0 (1 + P_{12}(T)(\sigma_1 + \sigma_2)) \times I = \quad (18)$$

$$\alpha_{SI}(T) SI_0 \left(1 + \frac{P_{12}(T)}{\pi_L(T) + \pi_T(T)} \frac{R_1 + R_2 - 2\alpha_R(T) R_0}{\alpha_R(T) R_0}\right) \times I =$$

$$\alpha_{SI}(T) SI_0 \left(1 + Q(T) \frac{R_1 + R_2 - 2\alpha_R(T) R_0}{\alpha_R(T) R_0}\right) \times I$$

$$Q(T) \equiv \frac{P_{12}(T)}{\pi_L(T) + \pi_T(T)}$$

It is noted that $\alpha_{SI}(T) SI_0$ in expressions (18) denotes a temperature compensation coefficient $K_T$, and $1 + Q(T)(R_1 + R_2 - 2\alpha_R(T) R_0)/\alpha_R(T) R_0$ denotes a mechanical stress compensation coefficient $K_\sigma$.

The compensation coefficient K in expressions (18) is calculated by the compensation coefficient calculation circuit 21 illustrated in FIG. 6. It is possible to compensate the amount of the variation of the Hall electromotive force of the Hall element 11 due to the mechanical stress and the temperature by using the compensation coefficient K calculated by the compensation coefficient calculation circuit 21 to obtain the accurate magnetic field B.

Figure 10:
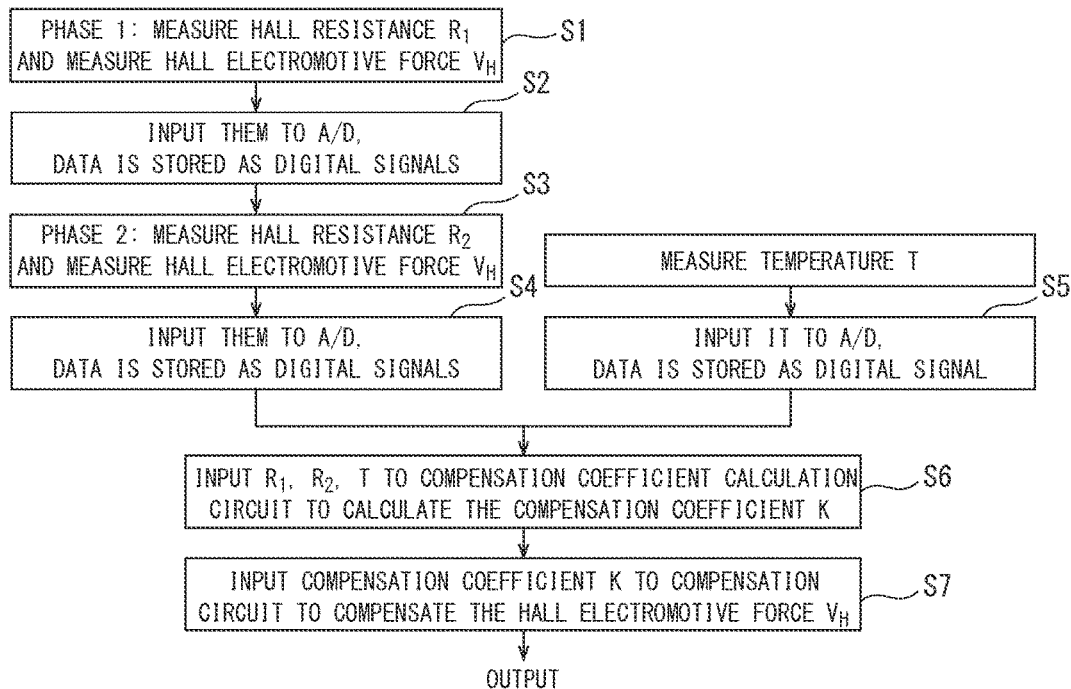
FIG. 10 is a flow chart illustrating a Hall electromotive force compensation method performed by a compensation coefficient calculation circuit illustrated in FIG. 6.

FIG. 10 is a flow chart illustrating a Hall electromotive force compensation method performed by the compensation coefficient calculation circuit illustrated in FIG. 6.

First, in Phase 1 illustrated in FIG. 8, the Hall resistance value $R_1$ is measured and the Hall electromotive force $V_H$ is measured (step S1). Next, the Hall resistance value $R_1$ is input to the A/D conversion circuit, the Hall electromotive force $V_H$ is input to the A/D conversion circuit, and the data is stored as digital signals (step S2). Next, in Phase 2 illustrated in FIG. 9, the Hall resistance value $R_2$ is measured and the Hall electromotive force $V_H$ is measured (step S3). Next, the Hall resistance value $R_2$ is input to the A/D conversion circuit, the Hall electromotive force $V_H$ is input to the A/D conversion circuit, and the data is stored as digital signals (step S4). Further, the temperature value T measured by the temperature sensor 15 is input to the A/D conversion circuit 16, and the data is stored as a digital signal (step S5).

Next, the Hall resistance value $R_1$, the Hall resistance value $R_2$, and the temperature value T is input to the compensation coefficient calculation circuit 21 of the compensation signal generation unit 20 to calculate the compensation coefficient K (step S6). Next, the compensation coefficient K calculated by the compensation coefficient calculation circuit 21 is input to the Hall electromotive force compensation circuit 22 to compensate the Hall electromotive force $V_H$ (step S7).

Figure 11:
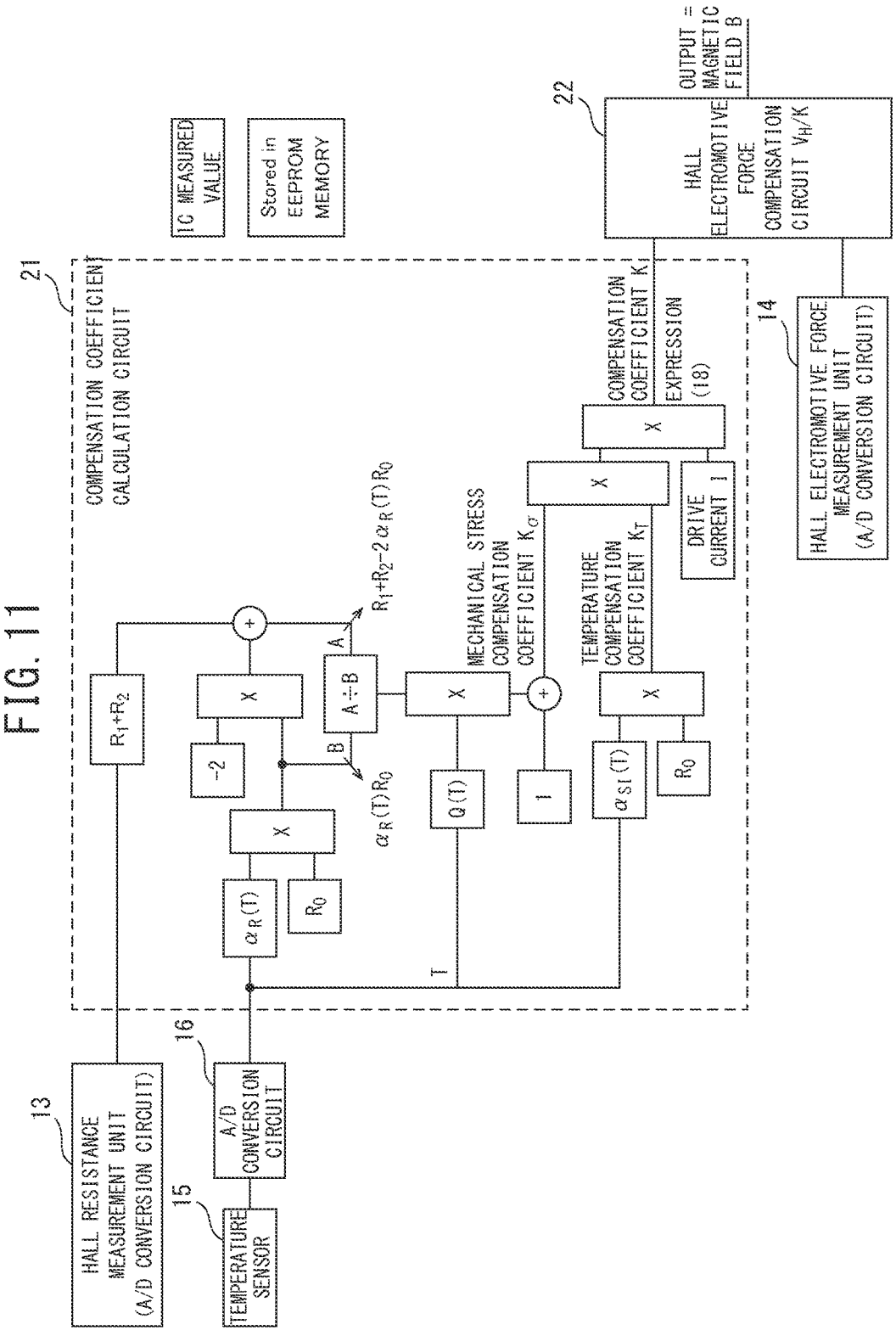
FIG. 11 is a specific configuration block diagram of a compensation coefficient calculation circuit illustrated in FIG. 6.

FIG. 11 is a specific configuration block diagram of the compensation coefficient calculation circuit illustrated in FIG. 6. It is noted that the same numerals are assigned to the components having the same functions as those in FIG. 6.

In Phase 1 illustrated in FIG. 8, the Hall resistance value $R_1$ is measured and is input to the A/D conversion circuit, and in Phase 2 illustrated in FIG. 9, the Hall resistance value $R_2$ is measured and is input to the A/D conversion circuit. On the other hand, the temperature value T measured by the temperature sensor 15 is input to the A/D conversion circuit 16.

The compensation coefficient calculation circuit 21 multiplies the temperature characteristic $\alpha_R(T)$ of the resistance value of the Hall element based on the digital signal of the temperature value T converted by the A/D conversion circuit 16 by the Hall resistance value $R_0$ at a reference temperature with the mechanical stress of zero to obtain $B=\alpha_R(T)R_0$. Further, the compensation coefficient calculation circuit 21 adds the digital signals of the Hall resistance values $R_1$ and $R_2$ converted by the A/D conversion circuit, and adds $R_1+R_2$ and $-2\alpha_R(T)R_0$ obtained by multiplying $B=\alpha_R(T)R_0$ by "-2" to obtain $A=R_1+R_2-2\alpha_R(T)R_0$.

Next, the compensation coefficient calculation circuit 21 divides A by B to obtain $A/B=(R_1+R_2-2\alpha_R(T)R_0)/\alpha_R(T)R_0$. The compensation coefficient calculation circuit 21 multiplies A/B by Q(T) based on the temperature value T and then adds "1" to the multiplication result to obtain the mechanical stress compensation coefficient $K_\sigma=1+Q(T)(R_1+R_2-2\alpha_R(T)R_0)/\alpha_R(T)R_0$. Further, the compensation coefficient calculation circuit 21 multiplies the temperature characteristic of the magnetic sensitivity of the Hall element $\alpha_{SI}(T)$ based on the temperature value T by the magnetic sensitivity $SI_0$ of the Hall element at a reference temperature with the mechanical stress of zero to obtain the temperature compensation coefficient $K_T=\alpha_{SI}(T)SI_0$.

Next, the compensation coefficient calculation circuit 21 multiplies the mechanical stress compensation coefficient $K_\sigma$ by the temperature compensation coefficient $K_T$, and furthermore, multiplies the multiplication result by the Hall drive current I to obtain the compensation coefficient $K=\alpha_{SI}(T)SI_0(1+Q(T)(R_1+R_2-2\alpha_R(T)R_0)/\alpha_R(T)R_0)I$. That is, expression (18) is obtained. As is clear from expression (18), the compensation coefficient K contains the mechanical stress compensation coefficient $K_\sigma$ and the temperature compensation coefficient $K_T$.

Furthermore, the Hall electromotive force compensation circuit 22 calculates $V_H/K$ from the digital signal of the Hall electromotive force $V_H$ converted by the A/D conversion circuit, to obtain a compensated value of the Hall electromotive force. In this way, the mechanical stress compensation coefficient $K_\sigma$ and the temperature compensation coefficient $K_T$ illustrated in FIG. 11 are combined to obtain the compensation coefficient K, thus the Hall electromotive force can be compensated.

The compensation coefficient K from the compensation coefficient calculation circuit 21 mentioned above includes the compensation of the effect of the temperature characteristic on the magnetic sensitivity and the compensation of the effect of the mechanical stress on the magnetic sensitivity. Since the compensation coefficient K for concurrently compensating the effect of the temperature characteristic and the effect of the mechanical stress can be obtained, it is possible to provide a method capable of compensating the magnetic sensitivity of the Hall element with high accuracy more easily.

Second Embodiment

FIG. 12 is a configuration block diagram illustrating the Hall electromotive force compensation device according to the second embodiment of the present invention. In the drawings, reference numeral 31 represents a shared A/D conversion circuit. It is noted that the same numerals are assigned to the components having the same functions as those in FIG. 6. Further, the descriptions of the Hall resistance measurement unit 13 and the Hall electromotive force measurement unit 14 are omitted.

The Hall electromotive force compensation device in the second embodiment includes the shared A/D conversion circuit 31, which is commonly used by the Hall resistance measurement unit 13, the Hall electromotive force measurement unit 14, and the temperature measurement unit 15. That is, the resistance value from the Hall resistance measurement unit 13, the Hall electromotive force from the Hall electromotive force measurement unit 14, and the temperature value from the temperature measurement unit 15 are time-divisionally measured by using the shared A/D conversion circuit 31.

Since temporal changes of the mechanical stress and the temperature are slow, it is not necessary to measure the mechanical stress and the temperature continually. Therefore, as illustrated in FIG. 12, the A/D conversion unit can be shared and the measurement is carried out in a time-division manner.

Third Embodiment

Figure 14:
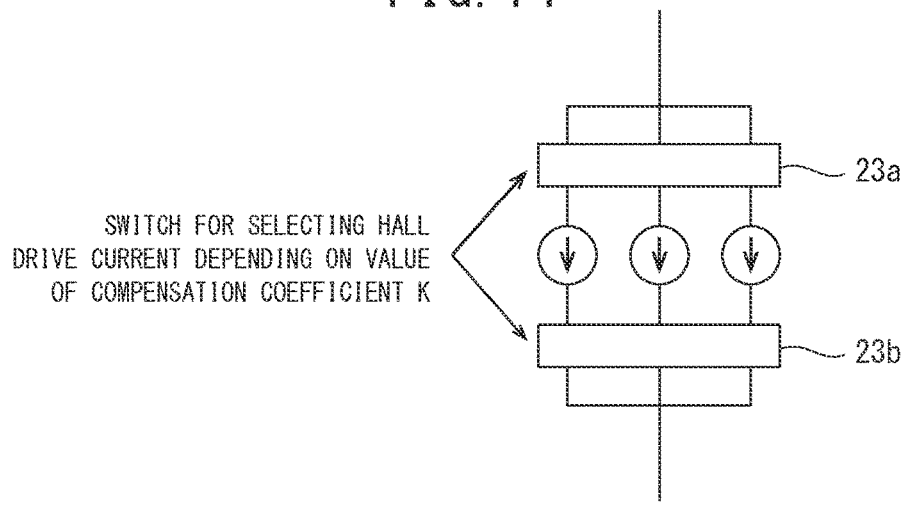
FIG. 14 is a configuration diagram of a Hall drive current source illustrated in FIG. 13.

FIG. 13 is a configuration block diagram illustrating the Hall electromotive force compensation device according to the third embodiment of the present invention, the configuration block diagram being configured to compensate the Hall electromotive force by the Hall drive current. FIG. 14 is a configuration diagram of a Hall drive current source illustrated in FIG. 13. In the drawings, reference numeral 32 represents an A/D conversion circuit shared between the Hall resistance measurement unit 13 and the temperature measurement unit 15. It is noted that the same numerals are assigned to the components having the same functions as those in FIG. 6. Additionally, the descriptions of the Hall resistance measurement unit 13 and the Hall electromotive force measurement unit 14 are omitted.

The Hall electromotive force compensation device according to the third embodiment is configured to adjust the current I from the Hall drive current source 23 for driving the Hall element 11 depending on the compensation coefficient K from the compensation coefficient calculation circuit 21 to compensate the Hall electromotive force. Switches 23a and 23b are provided for selecting the Hall drive current depending on the value of the compensation coefficient K.

Fourth Embodiment

Figure 16:
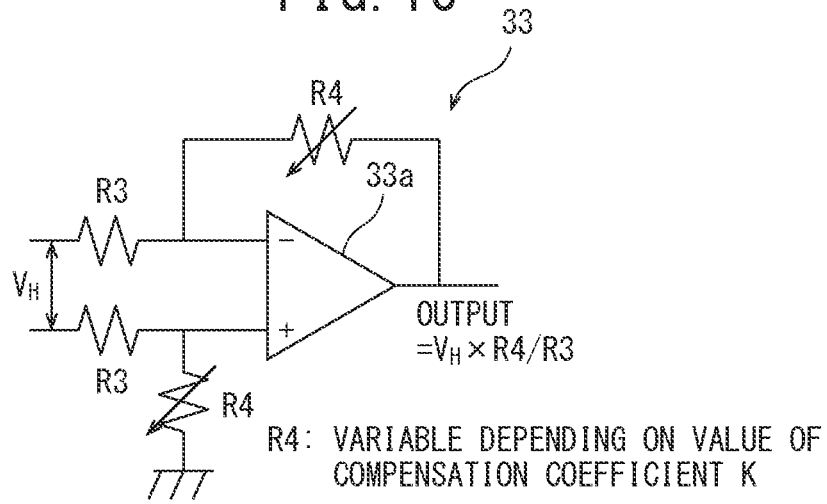
FIG. 16 is a configuration diagram of an amplifier circuit illustrated in FIG. 15.

FIG. 15 is a configuration block diagram illustrating the Hall electromotive force compensation device according to the fourth embodiment of the present invention, the configuration block diagram being configured to compensate the Hall electromotive force by an amplifier circuit. FIG. 16 is a configuration diagram of an amplifier circuit illustrated in FIG. 15. In the drawings, reference numeral 33 represents an amplifier circuit, and reference numeral 33a represents an operational amplifier. It is noted that the same numerals are assigned to the components having the same functions as those in FIG. 6. Additionally, the descriptions of the Hall resistance measurement unit 13 and the Hall electromotive force measurement unit 14 are omitted.

The Hall electromotive force compensation device according to the fourth embodiment includes the amplifier circuit 33 configured to amplify the Hall electromotive force from the Hall electromotive force measurement unit 14, and is configured to adjust a gain of the amplifier circuit 33 depending on the compensation coefficient K from the compensation coefficient calculation circuit 21 to compensate the Hall electromotive force. That is, when there is the amplifier circuit 33 on the signal processing path of the Hall electromotive force, the gain of the amplifier circuit 33 may be adjusted depending on the compensation coefficient K.

Furthermore, only the temperature compensation coefficient $K_T$ may be extracted from the compensation coefficients in expression (18) to perform only the temperature compensation. This corresponds to a compensation using following expression (19) as a part of the compensation coefficient K in expression (18).

$$K_T = \alpha_{SI}(T)SI_0 I \quad (19)$$

Furthermore, only the mechanical stress compensation coefficient $K_\sigma$ may be extracted from the compensation coefficients in expression (18) to perform only the mechanical stress compensation. This corresponds to a compensation using following expression (20) as a part of the compensation coefficient K in expression (18).

$$K_\sigma = SI_0\left(1 + \frac{P_{12}(T)}{\pi_L(T) + \pi_T(T)} \frac{R_1 + R_2 - 2\alpha_R(T)R_0}{\alpha_R(T)R_0}\right) \times I \quad (20)$$

Fifth Embodiment

Further, as illustrated in FIG. 8 and FIG. 9, the mechanical stress may be calculated by measuring the resistance values in the two directions. However, the resistance values may be measured at the same time by causing the current to flow through the adjacent terminals, as illustrated in FIG. 17. In this case, a mechanical stress component can be measured in Phase 1 (FIG. 17), and the Hall electromotive force can be measured in Phase 2 (FIG. 18).

FIG. 17 is a configuration block diagram illustrating the Hall electromotive force compensation device according to the fifth embodiment of the present invention, and a circuit configuration diagram illustrating an example of driving a Hall element (Phase 1: Hall resistance value measurement). FIG. 18 is a configuration block diagram illustrating the Hall electromotive force compensation device according to the fifth embodiment of the present invention, and a circuit configuration diagram illustrating an example of driving the Hall element (Phase 2: Hall electromotive force measurement). The supply of the Hall resistance value $V_R$ and the Hall electromotive force $V_H$ to the A/D conversion circuits is performed by use of chopper drive, as illustrated in FIG. 17 (Phase 1) and FIG. 18 (Phase 2).

First, in Phase 1 illustrated in FIG. 17, when the Hall drive voltage is applied across the terminal 1 and the terminal 2 to supply the Hall drive current I, the Hall resistance value $V_R$ is measured across the terminal 1 and the terminal 2. Next, in Phase 2 illustrated in FIG. 18, when the Hall drive voltage is applied across the terminal 2 and the terminal 4 to supply the Hall drive current I, the Hall electromotive force $V_H$ is measured across the terminal 1 and the terminal 3.

That is, the Hall electromotive force compensation device includes the chopper switch 12 connected to the terminal 1 to the terminal 4 of the Hall element 11. The chopper switch 12 applies the Hall drive voltage across the terminal 1 and the terminal 2 to supply the Hall drive current I such that the Hall resistance value $V_R$ is measured across the terminal 1 and the terminal 2, and applies the Hall drive voltage across the terminal 2 and the terminal 4 to supply the Hall drive current I such that the Hall electromotive force $V_H$ is measured across the terminal 1 and the terminal 3, by use of chopper drive.

Sixth Embodiment

FIG. 19 is a configuration block diagram illustrating the Hall electromotive force compensation device according to the sixth embodiment of the present invention, in which a mechanical stress compensation circuit and a temperature compensation circuit are separated from each other. In the drawings, reference numeral 41 represents the mechanical stress compensation circuit, and reference numeral 42 represents the temperature compensation circuit. It is noted that the same numerals are assigned to the components having the same functions as those in FIG. 6. Additionally, the descriptions of the Hall resistance measurement unit 13 and the Hall electromotive force measurement unit 14 are omitted.

The Hall electromotive force compensation device according to the sixth embodiment includes the mechanical stress compensation circuit 41 and the temperature compensation circuit 42 in a subsequent stage of the Hall electromotive force measurement unit 14, and is configured to compensate the Hall electromotive force on the basis of the mechanical stress compensation coefficient $K_\sigma$ and the temperature compensation coefficient $K_T$ from the compensation coefficient calculation circuit 21. That is, the mechanical stress compensation may be performed first, and then a compensation related to the temperature may be performed next.

Figure 20:
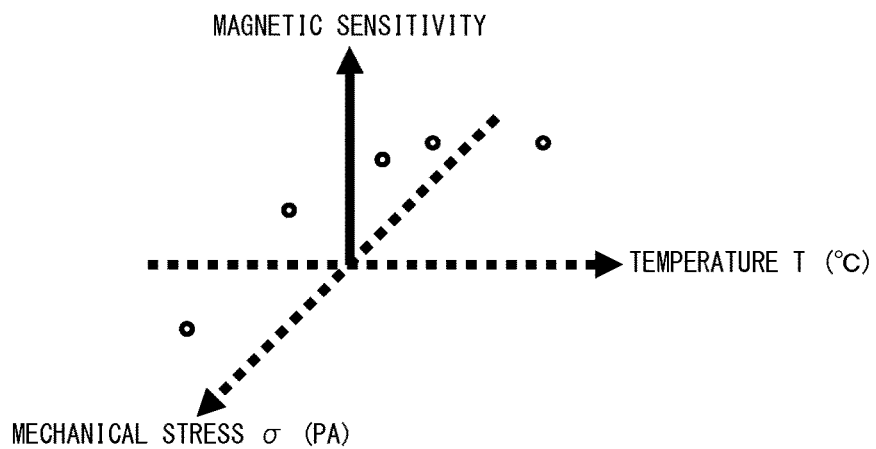
FIG. 20 is a view illustrating a concept of a magnetic sensitivity depending on temperature and mechanical stress in FIG. 19.
Figure 21:
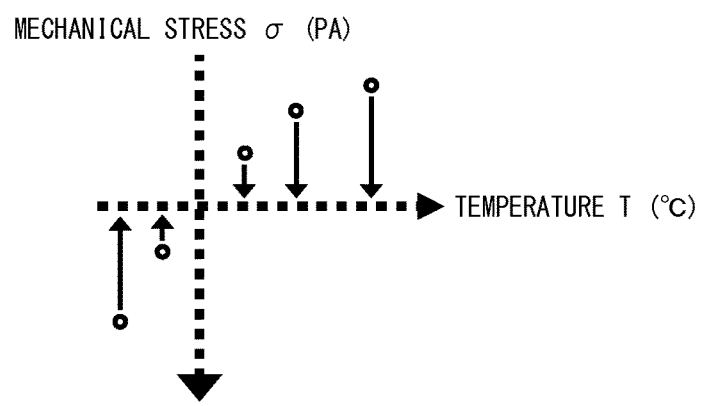
FIG. 21 is a view illustrating a case where mechanical stress in FIG. 19 has been compensated to be zero.
Figure 22:
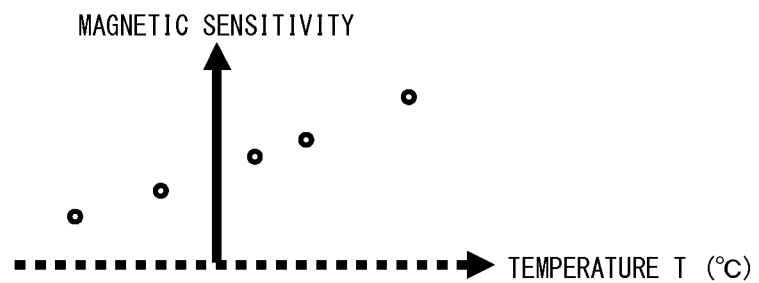
FIG. 22 is a view illustrating a concept of a magnetic sensitivity when mechanical stress in FIG. 19 has been compensated to be zero.

FIG. 20 is a view illustrating a concept of the magnetic sensitivity depending on both temperature and mechanical stress in FIG. 19. FIG. 21 is a view illustrating a case where the mechanical stress in FIG. 19 has been compensated to be zero. FIG. 22 is a view illustrating a concept of the magnetic sensitivity when the mechanical stress in FIG. 19 has been compensated to be zero.

Regarding the magnetic sensitivity that changes depending on two variables which are the temperature and the mechanical stress as illustrated in FIG. 20, the conversion to the axis where the mechanical stress is zero is performed in the first stage, as illustrated in FIG. 21. This corresponds to transforming the magnetic sensitivity into a single variable function, as illustrated in FIG. 22. Additionally, the temperature compensation may be performed first, and then the mechanical stress compensation may be performed next. Furthermore, only either one of the temperature compensation and the mechanical stress compensation may be performed.

Figure 23:
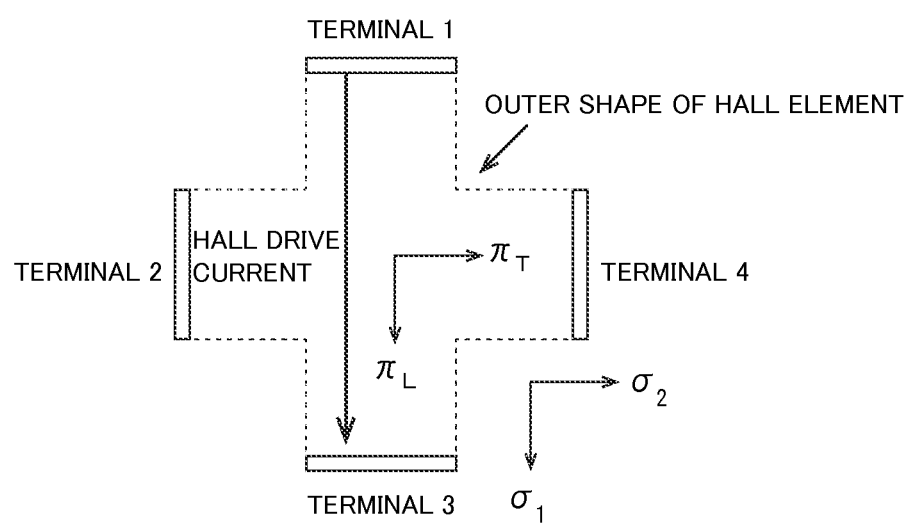
FIG. 23 is a view illustrating an outer shape of a Hall element.

FIG. 23 is a view illustrating an outer shape of the Hall element. By forming the outer shape of the Hall element in cross shape, the direction of the current driving the Hall element is aligned with the direction of the piezo-resistance coefficient, thus it is possible to improve the accuracy of the mechanical stress compensation. That is, the Hall resistance measurement unit 13 is configured to measure the resistance values in the two or more current directions of the Hall element having the cross shape.

Additionally, instead of the compensation of the Hall electromotive force as illustrated in FIG. 11, a magnetic field $B_{compensated}$ may be obtained by multiplying a magnetic field $B_{uncompensated}$ and the compensation coefficient after obtaining $B_{uncompensated}$, as following expressions (21).

$$B_{uncompensated} = \frac{V_H(=SI(T,\sigma) \times I \times B)}{I \times SI_0} \quad (21)$$

$$B_{compensated} = B_{uncompensated} \times \frac{SI_0}{SI(T,\sigma)}$$

$$\frac{SI_0}{SI(T,\sigma)} = \frac{1}{\alpha_{SI}(T)\left(1 + Q(T)\frac{R_1 + R_2 - 2\alpha_R(T)R_0}{\alpha_R(T)R_0}\right)}$$

As described above, it is possible to realize a Hall electromotive force compensation device capable of compensating the magnetic sensitivity of the Hall element with high accuracy more easily, by using one Hall element and the temperature sensor to perform the mechanical stress compensation and the temperature compensation while suppressing the increase of the layout area and the current consumption.

FIG. 24 is a flow chart illustrating a Hall electromotive force compensation method corresponding to the Hall electromotive force compensation device according to the first embodiment of the present invention.

This Hall electromotive force compensation method is used in a Hall electromotive force compensation device configured to perform the mechanical stress compensation and the temperature compensation for the Hall electromotive force on the basis of the mechanical stress and the temperature affecting the magnetic sensitivity of the Hall element 11.

First, the Hall resistance values $V_R$ in the two or more current directions across the plural of terminals of the Hall element 11 are measured by the Hall resistance measurement unit 13 (step S11). Next, the Hall electromotive force $V_H$ of the Hall element 11 is measured by the Hall electromotive force measurement unit 14 (step S12). Next, the environmental temperature of the Hall element 11 is measured by the temperature measurement unit 15 (step S13).

Next, the compensation coefficient K is calculated by the compensation coefficient calculation circuit 21 on the basis of the Hall resistance value $V_R$ measured by the Hall resistance measurement unit 13, and the temperature output value T measured by the temperature measurement unit 15 (step S14).

Next, the Hall electromotive force $V_H$ is compensated by the Hall electromotive force compensation circuit 22 on the basis of the Hall resistance value $V_R$ from the Hall resistance measurement unit 13 and the temperature output value T from the temperature measurement unit 15, and the Hall electromotive force is compensated by using the compensation coefficient K calculated by the compensation coefficient calculation circuit 21 (step S15).

As disclosed above, it is possible to realize a Hall compensation method of the electromotive force capable of compensating the magnetic sensitivity of the Hall element with high accuracy more easily, by using one Hall element and the temperature sensor to perform the mechanical stress compensation and the temperature compensation while suppressing the increase of the layout area and the current consumption.

According to the present invention, it is possible to compensate the effect of the mechanical stress applied to the Hall element and the effect of the temperature concurrently. Therefore, it is possible to realize a Hall electromotive force compensation device and a Hall electromotive force compensation method capable of compensating the magnetic sensitivity of the Hall element with high accuracy more easily, by using one Hall element and the temperature sensor to perform the mechanical stress compensation and the temperature compensation while suppressing the increase of the layout area and the current consumption.

REFERENCE SIGNS LIST 1 lead frame
2 Hall element
3 semiconductor integrated circuit
4 molding resin
11 Hall element
12 chopper switch
13 Hall resistance measurement unit
14 Hall electromotive force measurement unit
15 temperature sensor (temperature measurement unit)
16 A/D conversion circuit
19 Hall electromotive force compensation unit
20 compensation signal generation unit
21 compensation coefficient calculation circuit
22 Hall electromotive force compensation circuit
23 Hall drive current source
23a, 23b switch
24 magnetic sensitivity temperature characteristic information storage unit
25 resistance value temperature characteristic information storage unit
26 piezo coefficient temperature characteristic storage unit
31, 32 shared A/D conversion circuit
33 amplifier circuit
33a operational amplifier
41 mechanical stress compensation circuit
42 temperature compensation circuit

The invention claimed is:

1. A Hall electromotive force compensation device comprising:
   a Hall element configured to generate a Hall electromotive force;
   a compensation signal generation circuit configured to generate a compensation signal for compensating the Hall electromotive force of the Hall element; and
   a temperature measurement circuit configured to measure an environmental temperature of the Hall element to output temperature information of the Hall element,
   wherein the compensation signal generation circuit is configured to generate the compensation signal for compensating the Hall electromotive force of the Hall element on a basis of information of temperature characteristic of a piezo-resistance coefficient of the Hall element, information on temperature characteristic of a piezo-Hall coefficient of the Hall element, and the temperature information of the Hall element output by the temperature measurement circuit.

2. The Hall electromotive force compensation device according to claim 1, comprising a Hall electromotive force compensation circuit configured to compensate a physical quantity based on the Hall electromotive force on a basis of the compensation signal from the compensation signal generation circuit.

3. The Hall electromotive force compensation device according to claim 1, wherein the compensation signal generation circuit is configured to generate the compensation signal for compensating the Hall electromotive force of the Hall element on a basis of information on a temperature characteristic of the plurality of a magnetic sensitivity of the Hall element.

4. The Hall electromotive force compensation device according to claim 1, wherein the compensation signal generation circuit is configured to generate the compensation signal for compensating the Hall electromotive force of the Hall element on a basis of information on a temperature characteristic of the plurality of resistance values of the Hall element.

5. The Hall electromotive force compensation device according to claim 1, wherein the compensation signal generation circuit is configured to generate the compensation signal for compensating the Hall electromotive force of the Hall element on a basis of information on the temperature characteristic of the piezo coefficient of the Hall element.

6. The Hall electromotive force compensation device according to claim 5, wherein the information on the temperature characteristic of the piezo coefficient of the Hall element is at least one of information on a temperature characteristic of a piezo-Hall coefficient of the Hall element or information on a temperature characteristic of a piezo-resistance coefficient of the Hall element.

7. The Hall electromotive force compensation device according to claim 1, comprising:
   a Hall electromotive force measurement circuit configured to measure the Hall electromotive force of the Hall element; and
   a Hall resistance measurement circuit configured to measure plurality of resistance values across different terminal pairs of the Hall element to output the information depending on the plurality of resistance values.

8. The Hall electromotive force compensation device according to claim 7, wherein the Hall resistance measurement circuit, the Hall electromotive force measurement circuit, and the temperature measurement circuit commonly use a shared A/D conversion circuit.

9. The Hall electromotive force compensation device according to claim 7, wherein the Hall resistance measurement circuit is configured to measure the plurality of resistance values across the different terminal pairs of the Hall element having a cross shape.

10. The Hall electromotive force compensation device according to claim 7, wherein the temperature measurement circuit is a temperature sensor.

11. The Hall electromotive force compensation device according to claim 7, wherein the compensation signal generation circuit comprises a compensation coefficient calculation circuit.

12. The Hall electromotive force compensation device according to claim 11, a current supplied by a Hall drive current source for driving the Hall element is adjusted on a basis of a compensation coefficient from the compensation coefficient calculation circuit to compensate the Hall electromotive force.

13. The Hall electromotive force compensation device according to claim 11, comprising an amplifier circuit configured to amplify the Hall electromotive force from the Hall electromotive force measurement circuit,
   wherein a gain of the amplifier circuit is adjusted on a basis of a compensation coefficient from the compensation coefficient calculation circuit to compensate the Hall electromotive force.

14. The Hall electromotive force compensation device according to claim 11, comprising a stress compensation circuit and a temperature compensation circuit in a subsequent stage of the Hall electromotive force measurement circuit, wherein the Hall electromotive force is compensated on a basis of a stress compensation coefficient and a temperature compensation coefficient from the compensation coefficient calculation circuit.

15. A Hall electromotive force compensation method used in a Hall electromotive force compensation device including a Hall element configured to generate a Hall electromotive force, and a compensation signal generation circuit configured to generate a signal for compensating the Hall electromotive force of the Hall element, the Hall electromotive force compensation method comprising:
   a temperature measurement step performed by a temperature measurement circuit included in the Hall electromotive force compensation device for measuring an environmental temperature of the Hall element to output temperature information of the Hall element;
   a compensation signal generation step performed by the compensation signal generation circuit for generating the signal for compensating the Hall electromotive force of the Hall element on a basis of information of a temperature characteristic of a piezo-resistance coefficient of the Hall element, information on a temperature characteristic of a piezo-Hall coefficient of the Hall element, and the temperature information of the Hall element output by the temperature measurement circuit.

16. The Hall electromotive force compensation method according to claim 15, comprising compensating a physical quantity based on the Hall electromotive force on a basis of a compensation signal from the compensation signal generation circuit.

17. The Hall electromotive force compensation method according to claim 15, wherein the compensation signal generation step by the compensation signal generation circuit comprises generating the signal for compensating the Hall electromotive force of the Hall element on a basis of information on a temperature characteristic of a magnetic sensitivity of the Hall element.

18. The Hall electromotive force compensation method according to claim 15, wherein the compensation signal generation step performed by compensation signal generation circuit comprises generating the signal for compensating the Hall electromotive force of the Hall element on a basis of information on a temperature characteristic of a plurality of resistance values of the Hall element.

19. The Hall electromotive force compensation method according to claim 15, wherein the compensation signal generation step performed by the compensation signal generation circuit comprises generating the signal for compensating the Hall electromotive force of the Hall element on a basis of information on the temperature characteristic of the piezo coefficient of the Hall element.

20. The Hall electromotive force compensation method according to claim 19, wherein the information on the temperature characteristic of the piezo coefficient of the Hall element is at least one of information on a temperature characteristic of the piezo-Hall coefficient of the Hall element or information on a temperature characteristic of the piezo-resistance coefficient of the Hall element.

21. The Hall electromotive force compensation method according to claim 16, comprising:
  a Hall electromotive force measurement step for measuring the Hall electromotive force of the Hall element; and
  a Hall resistance measurement step for measuring a plurality of resistance values across different terminal pairs of the Hall element to output the information depending on the plurality of resistance values.

22. The Hall electromotive force compensation method according to claim 21, wherein measurement of a plurality of resistance values in the Hall resistance measurement step, measurement of the Hall electromotive force in the Hall electromotive force measurement step, and measurement of a temperature value in the temperature measurement step are time-divisionally performed by using a common A/D conversion circuit.

23. The Hall electromotive force compensation method according to claim 21, wherein the Hall resistance measurement step comprises measuring a plurality of resistance values across the different terminal pairs of the Hall element having a cross shape.

24. The Hall electromotive force compensation method according to claim 21, wherein the temperature measurement step comprises measuring with a temperature sensor.

25. The Hall electromotive force compensation method according to claim 21, wherein the compensation signal generation step performed by the compensation signal generation circuit comprises generating a compensation signal by using a compensation coefficient calculation circuit.

26. The Hall electromotive force compensation method according to claim 25, comprising changing a current supplied by a Hall drive current source for driving the Hall element on a basis of a compensation coefficient from the compensation coefficient calculation circuit to compensate the Hall electromotive force.

27. The Hall electromotive force compensation method according to claim 25,
  wherein an amplifier circuit is provided to amplify the Hall electromotive force measured in the Hall electromotive force measurement step, and
  a gain of the amplifier circuit is adjusted on a basis of a compensation coefficient from the compensation coefficient calculation circuit to compensate the Hall electromotive force.

28. The Hall electromotive force compensation method according to claim 25,
  wherein a mechanical stress compensation circuit and a temperature compensation circuit are provided in a subsequent stage after measurement of the Hall electromotive force in the Hall electromotive force measurement step; and
  the Hall electromotive force is compensated on a basis of a mechanical stress compensation coefficient and a temperature compensation coefficient from the compensation coefficient calculation circuit.

* * * * *